US012663711B2

(12) United States Patent
Syu et al.

(10) Patent No.: US 12,663,711 B2
(45) Date of Patent: Jun. 23, 2026

(54) METHOD AND SYSTEM TO FOR RAPID INSPECTION OF PHOTOLITHOGRAPHY RETICLE

(71) Applicant: Taiwan Semiconductor Manufacturing Co., Ltd., Hsinchu (TW)

(72) Inventors: Jia-Lin Syu, Hsinchu (TW); Tai-Yu Chen, Hsinchu (TW); Yi-Zhen Chen, Hsinchu (TW); Yen-Hsun Chen, Hsinchu (TW); Shang-Chieh Chien, Hsinchu (TW); Li-Jui Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 212 days.

(21) Appl. No.: 18/487,881

(22) Filed: Oct. 16, 2023

(65) Prior Publication Data

US 2025/0123555 A1 Apr. 17, 2025

(51) Int. Cl.
*G03F 1/84* (2012.01)
*G01N 21/88* (2006.01)
*G01N 21/956* (2006.01)

(52) U.S. Cl.
CPC ........... *G03F 1/84* (2013.01); *G01N 21/8851* (2013.01); *G01N 21/95607* (2013.01); *G01N 2021/8883* (2013.01); *G01N 2021/95615* (2013.01); *G01N 2021/95676* (2013.01)

(58) Field of Classification Search
CPC .................. G03F 1/84; G01N 21/8851; G01N 21/95607; G01N 2021/8883; G01N 2021/95615; G01N 2021/95676
See application file for complete search history.

(56) References Cited

U.S. PATENT DOCUMENTS

| | | | | |
|---|---|---|---|---|
| 10,181,185 | B2 * | 1/2019 | Park | G06T 7/001 |
| 11,257,207 | B2 * | 2/2022 | Fang | G06T 7/001 |
| 11,776,108 | B2 * | 10/2023 | Wallingford | G06T 7/70 |
| | | | | 382/149 |
| 12,038,694 | B2 * | 7/2024 | Zhang | G03F 7/70616 |
| 2023/0037918 | A1 * | 2/2023 | Pang | G06N 3/094 |

FOREIGN PATENT DOCUMENTS

| | | |
|---|---|---|
| CN | 114690541 A | 7/2022 |
| TW | 202232248 A | 8/2022 |
| TW | 202235998 A | 9/2022 |

* cited by examiner

*Primary Examiner* — Hung V Nguyen
(74) *Attorney, Agent, or Firm* — Seed IP Law Group

(57) ABSTRACT

A method for operating a reticle inspection system includes training an analysis model of the reticle inspection system with a machine learning process, generating a difference threshold based on the machine learning process, storing a reference image, and generating a scan image of a reticle with the reticle inspection system. The method includes generating a relative difference value by comparing the scan image to the reference image. The method includes, if the relative difference value is less than the difference threshold, determining that the reticle is not defective. The method includes, if the relative difference value is greater than the difference threshold, determining that the reticle is defective.

20 Claims, 16 Drawing Sheets

400

Reticle Exposure
402

Scan Reticle
404

Scan result output
406

Analysis Model analyzes
scan result output in
accordance with one or
more processes
408

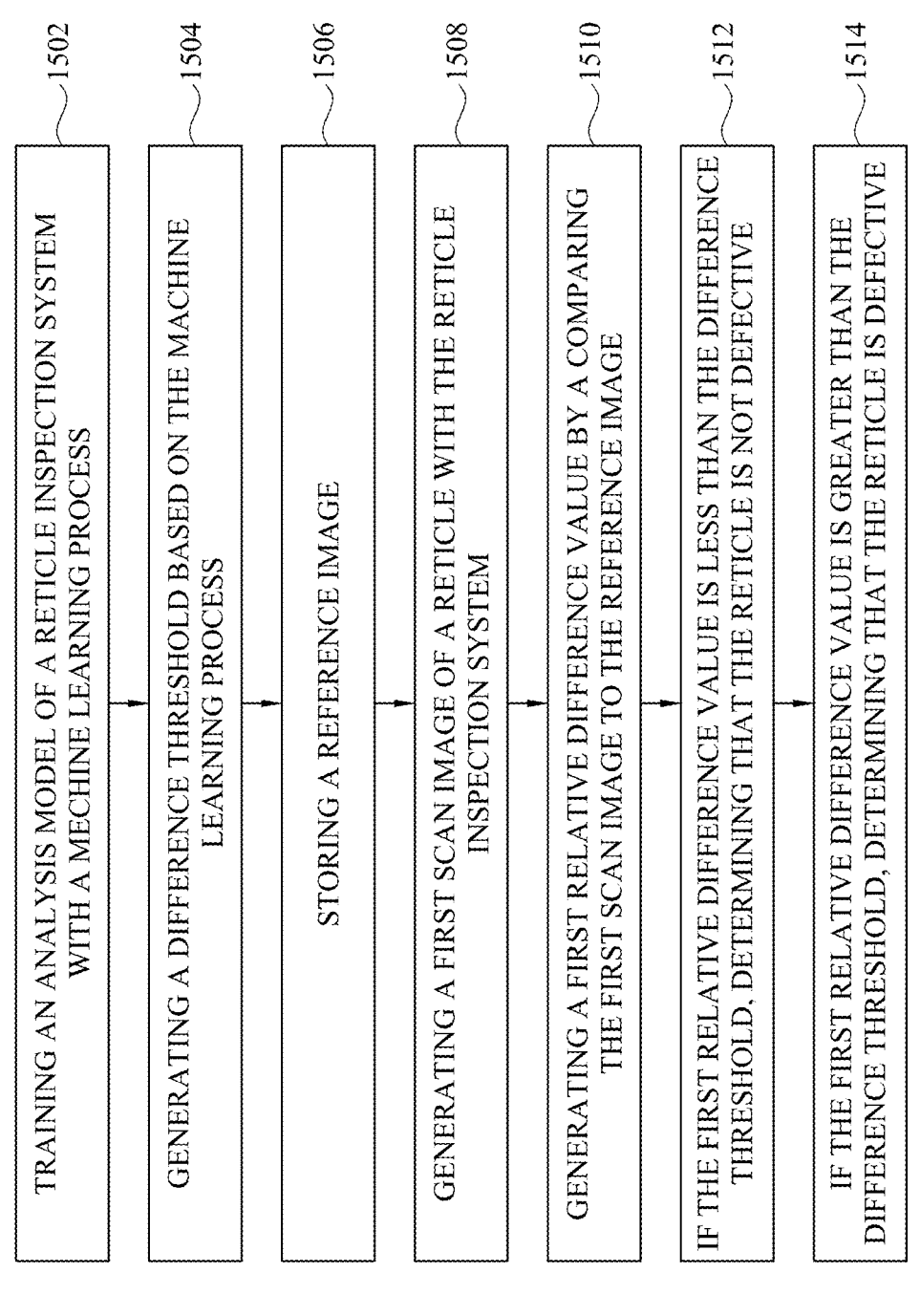

TRAINING AN ANALYSIS MODEL OF A RETICLE INSPECTION SYSTEM WITH A MECHINE LEARNING PROCESS ⟍1502

GENERATING A DIFFERENCE THRESHOLD BASED ON THE MACHINE LEARNING PROCESS ⟍1504

STORING A REFERENCE IMAGE ⟍1506

GENERATING A FIRST SCAN IMAGE OF A RETICLE WITH THE RETICLE INSPECTION SYSTEM ⟍1508

GENERATING A FIRST RELATIVE DIFFERENCE VALUE BY A COMPARING THE FIRST SCAN IMAGE TO THE REFERENCE IMAGE ⟍1510

IF THE FIRST RELATIVE DIFFERENCE VALUE IS LESS THAN THE DIFFERENCE THRESHOLD, DETERMINING THAT THE RETICLE IS NOT DEFECTIVE ⟍1512

IF THE FIRST RELATIVE DIFFERENCE VALUE IS GREATER THAN THE DIFFERENCE THRESHOLD, DETERMINING THAT THE RETICLE IS DEFECTIVE ⟍1514

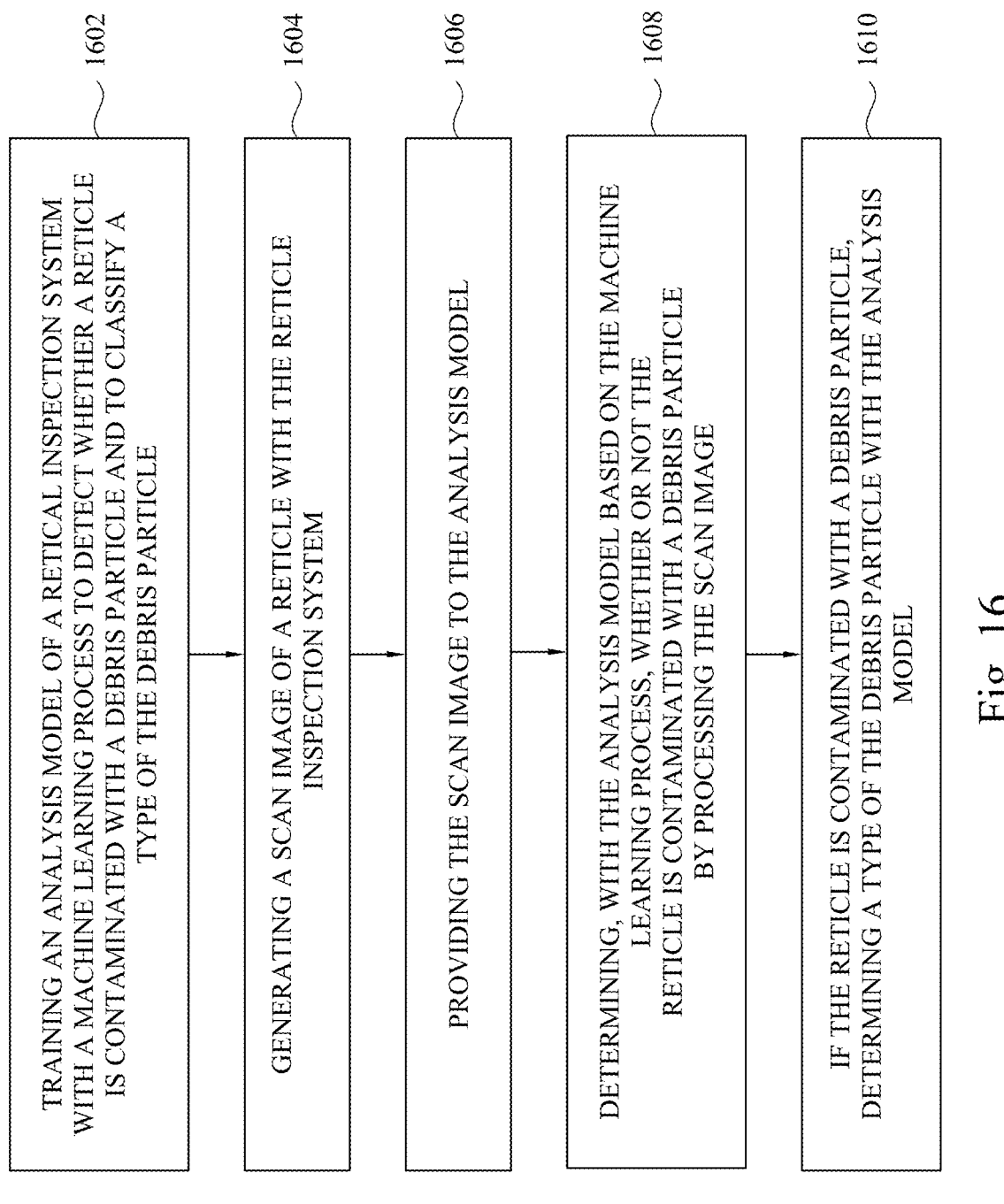

1602

TRAINING AN ANALYSIS MODEL OF A RETICAL INSPECTION SYSTEM WITH A MACHINE LEARNING PROCESS TO DETECT WHETHER A RETICLE IS CONTAMINATED WITH A DEBRIS PARTICLE AND TO CLASSIFY A TYPE OF THE DEBRIS PARTICLE

1604

GENERATING A SCAN IMAGE OF A RETICLE WITH THE RETICLE INSPECTION SYSTEM

1606

PROVIDING THE SCAN IMAGE TO THE ANALYSIS MODEL

1608

DETERMINING, WITH THE ANALYSIS MODEL BASED ON THE MACHINE LEARNING PROCESS, WHETHER OR NOT THE RETICLE IS CONTAMINATED WITH A DEBRIS PARTICLE BY PROCESSING THE SCAN IMAGE

1610

IF THE RETICLE IS CONTAMINATED WITH A DEBRIS PARTICLE, DETERMINING A TYPE OF THE DEBRIS PARTICLE WITH THE ANALYSIS MODEL

METHOD AND SYSTEM TO FOR RAPID INSPECTION OF PHOTOLITHOGRAPHY RETICLE

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

The features in an integrated circuit are produced, in part, with the aid of photolithography. Traditional photolithography techniques include generating a reticle (or mask) outlining the pattern of features to be formed on an integrated circuit die. The photolithography light source irradiates the integrated circuit die via the reticle. The size of the features that can be produced via photolithography of the integrated circuit die is affected, in part, on the lower end, by the wavelength of light produced by the photolithography light source. Smaller wavelengths of light can produce smaller feature sizes.

As the patterns in reticles continue to become increasingly denser, any defects or contamination of the reticle can result in such defects being transferred to the patterns formed in the wafer. Accordingly, reticle inspection procedures are implemented to help ensure that the reticle does not have any defects. If a reticle inspection procedure detects a defect, then the reticle may go through a lengthy cleaning process during which wafer processing is halted. Furthermore, previously processed wafers may be inspected to ensure that there are no defects in the wafers resulting from the defective reticle. One potential problem is that an inspection process may incorrectly determine that a reticle is defective, resulting in an expensive and time-consuming halt in the wafer processing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 15 is a flow diagram of a method for operating a reticle inspection system, in accordance with some embodiments.

FIG. 16 is a flow diagram of a method for operating a reticle inspection system, in accordance with some embodiments.

DETAILED DESCRIPTION

Figure 1:
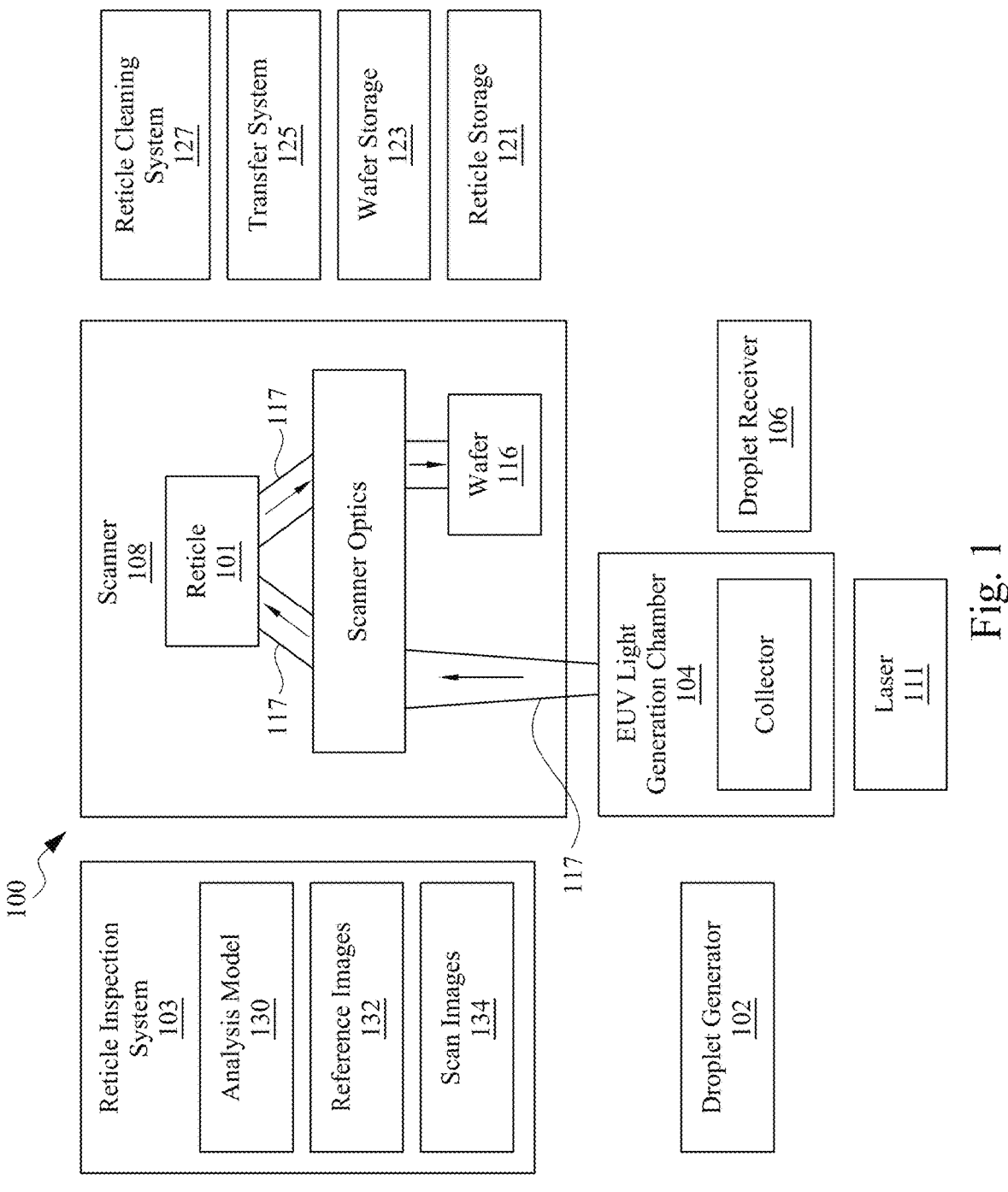
FIG. 1 is a block diagram of an EUV photolithography system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as "about," "substantially," and the like, should be interpreted as one having ordinary skill in the art would in view of current technological norms.

Embodiments of the disclosure provide a system and method for reliably inspecting photolithography reticles. Embodiments of the present disclosure utilize a reticle inspection system that includes an analysis model trained with a machine learning process to assist in inspecting photolithography reticles between exposures. The reticle inspection system stores one or more reference images of a reticle. In an inspection process, the reticle inspection system captures new scans of a reticle and compares them to the reference images. The reticle inspection system utilizes the analysis model to ensure that the inspection is accurate and efficient so that a reticle is not erroneously determined to be defective.

In some embodiments, the reticle inspection system can train the analysis model with a training set that includes images or scans of both defective and non-defective reticles. After training, the analysis model can analyze scans of a reticle to determine whether or not the reticle is defective. In some embodiments, the analysis model can judge whether or not a reticle is defective and can also help to judge types of defects. The analysis model can also be utilized to determine whether or not a current scan of a reticle should be utilized to partially or completely overwrite one or more reference images utilized by the reticle inspection system. In some embodiments, reticle characteristic parameters and reticle inspection system parameters can be provided to a machine learning database for training the analysis model. The analysis model can then generate simulated reference images to assist in future inspections of reticles. This can help reduce false defect counts and improve inspection tool quality.

Embodiments of the present disclosure provide several benefits. In particular, the number of false defect counts is greatly reduced or entirely eliminated. This results in fewer instances of unnecessary reticle cleaning and wafer inspection. This helps ensure that wafer processing is not halted, resulting in more processed wafers over time and better wafer yields. Expensive reticle cleaning is also avoided.

FIG. 1 is a block diagram of an EUV photolithography system 100, according to some embodiments. The components of the EUV photolithography system 100 cooperate to perform photolithography processes and to inspect photolithography reticles. As will be set forth in more detail below, the photolithography system 100 utilizes multiple high-NA bright field reticles to produce a single pattern on a wafer. As used herein, the terms "EUV light" and "EUV radiation" can be used interchangeably. While description of the figures may primarily focus on EUV reticles, principles of the present disclosure extend to reticles utilized in photolithography processes other than EUV photolithography processes.

The EUV photolithography system 100 includes a droplet generator 102, an EUV light generation chamber 104, a droplet receiver 106, a scanner 108, and a laser 111. The droplet generator 102 outputs droplets into the EUV light generation chamber 104. The laser 111 irradiates the droplets with pulses of laser light within the EUV light generation chamber 104. The irradiated droplets emit EUV light 117. The EUV light 117 is collected by a collector 114 and reflected toward the scanner 108. The scanner 108 conditions the EUV light 117, reflects the EUV light 117 off of reticle 101 including a mask pattern, and focuses the EUV light 117 onto the wafer 116. The EUV light 117 patterns a layer on the wafer 116 in accordance with a pattern of the reticle 101. Each of these processes is described in more detail below.

The droplet generator 102 generates and outputs a stream of droplets. The droplets can include tin, though droplets of other material can be utilized without departing from the scope of the present disclosure. The droplets move at a high rate of speed toward the droplet receiver 106. The droplets have an average velocity between 60 m/s to 200 m/s. The droplets have a diameter between 10 µm and 200 µm. The generator may output between 1000 and 100000 droplets per second. The droplet generator 102 can generate droplets having different initial velocities and diameters than those described above without departing from the scope of the present disclosure.

In some embodiments, the EUV light generation chamber 104 is a laser produced plasma (LPP) EUV light generation system. As the droplets travel through the EUV light generation chamber 104 between the droplet generator 102 and the droplet receiver 106, the droplets are irradiated by the laser 111. When a droplet is irradiated by the laser 111, the energy from the laser 111 causes the droplet to form a plasma. The plasmatized droplets generate EUV light 117. This EUV light 117 is collected by the collector 114 and passed to the scanner 108 and then on to the wafer 116.

In some embodiments, the laser 111 is positioned external to the EUV light generation chamber 104. During operation, the laser 111 outputs pulses of laser light into the EUV light generation chamber 104. The pulses of laser light are focused on a point through which the droplets pass on their way from the droplet generator 102 to the droplet receiver 106. Each pulse of laser light is received by a droplet. When the droplet receives the pulse of laser light, the energy from the laser pulse generates a high-energy plasma from the droplet. The high-energy plasma outputs EUV light 117.

In some embodiments, the laser 111 irradiates the droplet with two pulses. A first pulse causes the droplet to flatten into a disk like shape. The second pulse causes the droplet to form a high temperature plasma. The second pulse is significantly more powerful than the first pulse. The laser 111 and the droplet generator 102 are calibrated so that the laser emits pairs of pulses such that the droplet is irradiated with a pair of pulses. The laser can irradiate droplets in a manner other than described above without departing from the scope of the present disclosure. For example, the laser 111 may irradiate each droplet with a single pulse or with more pulses than two. In some embodiments, there are two separate lasers. A first laser delivers the flattening pulse. A second laser delivers the plasmatizing pulse.

In some embodiments, the light output by the droplets scatters randomly in many directions. The photolithography system 100 utilizes the collector 114 to collect the scattered EUV light 117 from the plasma and direct or output the EUV light 117 toward the scanner 108.

The scanner 108 includes scanner optics 110. The scanner optics 110 include a series of optical conditioning devices to direct the EUV light 117 to the reticle. The scanner optics 110 may include refractive optics such as a lens or a lens system having multiple lenses (zone plates). The scanner optics 110 may include reflective optics, such as a single mirror or a mirror system having multiple mirrors. The scanner optics 110 direct the ultraviolet light from the EUV light generation chamber 104 to a reticle 101.

FIG. 1A illustrates a first reticle 101 within the scanner 108. Though not shown, the reticle 101 may be coupled to a mount. The mount holds the reticle 101a during a photolithography process. A photolithography process may also be described as an "exposure" as the reticle 101 is exposed to EUV light during the photolithography process.

During an EUV exposure process, EUV light 117 reflects off of the reticle 101 back toward further optical features of the scanner optics 110. In some embodiments, the scanner optics 110 include a projection optics box. The projection optics box may have refractive optics, reflective optics, or combination of refractive and reflective optics. The projection optics box directs the EUV light 117 onto the wafer 116, for example, a semiconductor wafer.

The EUV light 117 includes a pattern from the reticle 101. In particular, the reticle 101 includes the pattern to be defined in the wafer 116. After the EUV light 117 reflects off of the reticle 101, the EUV light 117 contains the pattern of the reticle 101. A layer of photoresist typically covers the wafer 116 during extreme ultraviolet photolithography irradiation. The photoresist assists in patterning a surface of the semiconductor wafer 116 in accordance with the pattern of the reticle.

The pattern of the reticle 117 may be extremely dense with very small features. Accordingly, if there are any defects on the reticle 117, such defects may result in malformation of features or patterns on the wafer 116. Various types of defects can occur.

One type of reticle defect is contamination of the reticle by debris particles. As described previously, EUV light 117 may be generated by irradiating tin droplets with powerful lasers. This sometimes can result in very tiny tin debris particles traveling from the EUV light generation chamber 104 into the scanner 108. The tin debris particles may adhere to the exposure surface of the reticle 101. Such debris particles may result in reflected EUV light 117 carrying the pattern that includes the debris particles. This can result in malformation of features on the wafer 116. Furthermore, other types of debris particles can impact the reticle 117. For example, microscopic dust particles or other types of debris particles may enter the scanner 108 and accumulate on the reticle 101.

Other types of reticle defects can include delamination of layers of material that make up the reticle 101, coating peeling, material concentration, scattering, roughness, coating deformation, oxidation, reduction, organic cross-link, or other types of defects. Each of these defects can result in incorrect formation of features or patterns in the wafer 116.

In order to ensure that a reticle is not contaminated prior to an exposure, it may be beneficial to implement a wafer inspection process. One possible solution is to have a reticle inspection system capture images of the reticle. If the reticle inspection system detects a defect, then a human may inspect the scans in order to determine whether or not a defect is indeed present. However, inspection by humans is costly, time-consuming, and prone to error.

Another possible solution is to utilize one or more reference images corresponding to images of a reticle without defect for comparison with the current scans of a reticle in order to detect a defect in the reticle based on whether or not the current scans are different from the one or more reference images. However, as a reticle is used in multiple exposure processes, aspects of the reticle may change over time without being defective. For example, there may be decreases in reticle reflectivity or brightness that do not correspond to actual defects because the reticle may continue to properly form features in wafers with somewhat changed reflectivity or brightness. However, such decreases in the reflectivity or brightness may be flagged during a comparison of the reference image, resulting in a faulty determination of defect in the reticle.

Embodiments of the present disclosure utilize a reticle inspection system 103 that includes an analysis model 130 to assist in inspecting the reticle 101. The analysis model 130 is trained with one or more machine learning processes to assist in detecting reticle defects.

In some embodiments, the reticle inspection system 103 trains the analysis model 130 with a machine learning process to detect defects in the reticle 101. The machine learning process can include generating a training set that includes images of reticles with defects and reticles without defects. During the machine learning process, the analysis model 130 is trained through iterations to correctly identify which images from the training set correspond to defective reticles and which images correspond to reticles without defect. The training process can include training the neural network of the analysis model in iterations to accurately classify each image from the training set. The training process is complete when the analysis model 130 is able to correctly classify images of the training set within a selected error tolerance.

After training the analysis model 130, the analysis model can be utilized to assist the reticle inspection system 130 in detecting defects in the reticle 101. For example, after a selected number of exposures of the reticle 101, the reticle inspection system 134 may collect scan images 134 of the reticle 101. The scan images can include optical images, electron microscope images, or other types of scan images. The scan images 134 are then processed by the analysis model 130. The analysis model 130 determines whether or not the reticle 101 is defective.

In some embodiments, the analysis model 130 may return a confidence score indicating how confident the analysis model 130 is that there is a defect or that there is no defect. If the confidence score is a lower than a selected threshold value, then a human may be called for to inspect the scan images 134. If the confidence score is higher than the selected threshold value, then the reticle 101 may be provided to the reticle cleaning system 127.

In some embodiments, the analysis model 130 can be utilized to determine what type of defect is present in the reticle 101. During the machine learning process of the analysis model 130, a training set can be gathered that labels training set images based on whether or not there is a defect and what type of defect is present. A machine learning process can then be performed that trains the analysis model to classify scan images as one of a plurality of types of defects or no defect at all. Some examples of defect classifications can include contamination by droplet debris, contamination by particles other than droplets, absorption degradation, reflection degradation, coating peeling, material concentration, scattering, roughness, coating deformation, oxidation, reduction, organic cross-link, or other types of defects.

In some embodiments, the reticle inspection system 103 utilizes reference images to detect defects in the reticle 101. The reticle inspection system 103 capture scan images 134 of the reticle 101 and compares the scan images to reference images 132. If the scan images 134 are sufficiently different from the reference images 132, then the reticle inspection system 103 may determine that the reticle 101 is defective. In some embodiments, the analysis model 130 can assist in the comparison between the reference images 132 and the scan images 134.

However, as set forth previously, one problem with traditional approaches is that over time with repeated exposures some characteristics of the reticle 101 may change in a manner that does not result in improper function of the reticle 101. In other words, some changes, and even some types of degradation can occur to the reticle 101 without causing the reticle 101 to fail to properly form patterns or features on the wafer 116.

In an example in which the reticle 101 is an EUV reticle, the reticle may be made up of a reflective multilayer on a substrate. The reflective multilayer reflects the EUV light. The EUV reticle may also include a layer of the absorption material on the reflective multilayer. The absorption material absorbs EUV light. The pattern of the reticle is formed by patterning the absorption material to expose the reflective multilayer in accordance with a pattern of trenches formed in the absorption material. When the EUV light 117 is incident on the EUV reticle, some of the EUV light will be absorbed by the absorption material and some of the EUV light will be reflected by the reflective multilayer. The reflected EUV light 117 includes the pattern of the reticle.

However, with large numbers of exposures, the reflectivity of the reflective multilayer can change. Additionally, the absorption properties of the absorption material can also change. The result is that the brightness order reflectivity of the reticle 101 can change over time without causing failure of the reticle 101 to properly form patterns in the wafer 116. Yet if a simple comparison is made between a reference image 132 corresponding to a new reticle and a scan the image 134 corresponding to a reticle 101 that has gone too many exposures, the difference in brightness reflectivity could trigger a reticle inspection system to identify the reticle 101 is defective.

In some embodiments, the reticle inspection system 103 overcomes this issue by updating the reference images 132 with the most recent scan images 134 if the most recent scan images 134 do not correspond to a defective reticle 101. In this way, as the reticle 101 ages and is not defective, the reference images 132 are continuously updated or replaced by the most recent scan images 134 so that there is never a large difference between a new scan image 134 and the reference images 132 unless a genuine defect has occurred.

In some embodiments, the reticle inspection system 103 can replace portions of the reference image 132 with portions of a scan image 134. Accordingly, the reticle inspection system 103 can selectively replace an entire reference image 132 with a most recent scan image 134 or can selectively replace one or more portions of a reference image 132 with one or more corresponding portions of a most recent scan image 134. The analysis model 130 can be trained to determine whether or not a reference image should be updated or replaced by a recent scan image 134.

In some embodiments, the analysis model 130 can be trained to generate simulated reference images 132. For example, the analysis model 130 can be trained with a training set that includes a large number of scan images across the lifetimes of a large number of reticles. The analysis model 130 can be trained to generate reference images based on the number of exposures and other operating parameters associated with the reticle 101. This is because the training process trains the analysis model to know what a healthy reticle 101 should look like at a given stage of life based on the number of exposures and based on other operating parameters associated with the reticle 101 and the reticle inspection system 103.

For example, scan images generated by the reticle inspection system 103 may be affected by various parameters of the reticle inspection system 103. In an example in which the reticle inspection system 103 utilizes one or more lasers for scanning a reticle 101, operating parameters of the reticle inspection system 103 can include being powered, beam position, beam stability, beam size, wavelength purity, pulse duration, timing control, laser heating, lens heating, isolator stability, acousto-optic modulation (AOM) stability, acousto-optic tunable filter (AOTF) stability, and other parameters. Other image generation parameters that can affect the generation scan images can include chip photoelectric conversion efficiency and stability, channel consistency calibration, and dark noise associated with charge coupled devices, CMOS devices, CMOS time delay integration devices, and other factors. Parameters associated with the stage that holds the reticle 101 in the reticle inspection system 103 can include vibration, X, Y, and Z direction stability, leveling, stage acceleration, and stage movement speed. Parameters associated with optical modulation of the reticle inspection system 103 can include objective temperature, lens transmission, and focus stability. Other factors can include mask usage, EUV movement, exposure die size, dosage, material concentration, treatment, and storage time.

All of these factors, and others, associated with both the reticle and with the reticle inspection system 103 can impact the generation scan images 134. Accordingly, the training process for the analysis model 130 can utilize a large amount of data related to a large number of reticle inspection systems 103, reticles 101, reticle scans, and other data in order to train the analysis model 130 to understand how a scan of a healthy reticle should appear based on parameters of the reticle 101, the usage of the reticle 101, and the parameters of the reticle inspection system 103.

The training process can enable the analysis model 130 to generate simulated reference images based on the known characteristics of the reticle 101 and the reticle inspection system 103. Accordingly, prior to an upcoming scan of a reticle 101, the parameters associated with the reticle 101 and the reticle inspection system 103 can be provided to the trained analysis model 130. The trained analysis model 130 can then generate one or more simulated reference images to be used as the reference images 132 for inspecting the reticle 101. The reticle inspection system 103 can then capture new scan images 134 of the reticle 101 and can compare the new scan images 134 to the simulated reference images. The analysis model 130 can then detect defects in the reticle 101 based on differences between the new scan images 134 and the simulated reference images. The comparison can take into account lateral image shift, reflectance calibration and liking factors, focus/Z position map, and defect scan image area analysis. Scan data can be overwritten based on scan image quality analysis such as focus, position shift stability, and reflected stability. The reference data can be overwritten for all areas of the reticle, a single stride, multiple stripes, or various local area regions can be overwritten.

In in some embodiments, the reticle inspection system 103 can utilize a difference threshold, also known as a spec, to assist in determining whether or not defects are present in the reticle 101. As one example, there may be a large variation in healthy practices or reflection levels for healthy reticles over time. When comparing a scan image to a reference image, the difference threshold can take into account the large potential variation in brightness reflection. As long as the difference between a reference image in a scan image is less than the difference threshold, then the reticle 101 can be considered to be without defect. However, if the difference between the reference image and a scan image is greater than the difference threshold, then the reticle inspection system 103 may determine that the reticle 101 has defects. If the difference falls within the difference threshold, then the analysis model 130 can determine whether or not to automatically replace the reference image 132 (fully or partially) with the current scan image.

The EUV system 100 includes a reticle storage 121. The reticle storage 121 may include storage and protection pods that enclose and protect the reticle 101 when the reticle 101 are not in use. After the reticle 101 have been initially manufactured, the reticle 101 may immediately be enclosed in the reticle storage 121. The reticle 101 remains in the reticle storage 121 during transport from the manufacturing site to the wafer processing site. The reticle storage 121 may provide very strong protection against contaminants when the reticle 101 is not in use.

The reticle 101 may remain in the reticle storage 121 until the reticle 101 are to be utilized in the EUV photolithography process. At this time, the reticle 101 are transferred from the reticle storage 121 into the scanner 108. The reticle storage 121, or portions of the reticle storage 121 may be carried into the scanner 108. The reticle 101 are then unloaded from the reticle storage onto the mount, in turn, for the double exposure EUV process. After the EUV process, the reticle 101 are unloaded from the mount to the reticle storage 121.

The EUV photolithography system 100 may also include a wafer storage 123. The wafer storage 123 stores wafers 116 when the wafers are not in use. The wafer storage 123 may include storage for wafers 116 that have yet to be transferred into the scanner 108 for patterning. The wafer storage may include storage for wafers 116 that have already been patterned within the scanner 108.

The EUV system 100 includes a transfer system 125. The transfer system 125 may include one or more robot arms. The one or more robot arms can transfer the reticle 101 between the scanner 108, the reticle storage 121, a reticle scanner, and a reticle cleaning station. The one or more robot arms can also transfer wafers 116 between the scanner 108 and the wafer storage 123. In some embodiments, robot arms that transfer wafers 116 are separate from robot arms that transfer the reticle 101. The EUV system 100 can include other types of reticle transport systems without departing from the scope of the present disclosure.

The EUV system 100 includes a reticle cleaning system 127. When the reticle inspection system 103 determines that there are defects or contamination in the reticle 101, the transfer system 125 can transfer the reticle 101 from the scanner 108 to the reticle cleaning system 127. As described previously, the process of cleaning the reticle is time-consuming and expensive. During the cleaning, the reticle 101 cannot be used to process wafers 116. Accordingly, it is very costly to erroneously determine that the reticle 101 is defective. Thus, the reticle inspection system 103 of FIG. 1 is highly beneficial in reducing or eliminating entirely false detection of defects in the reticle 101.

Figure 2:
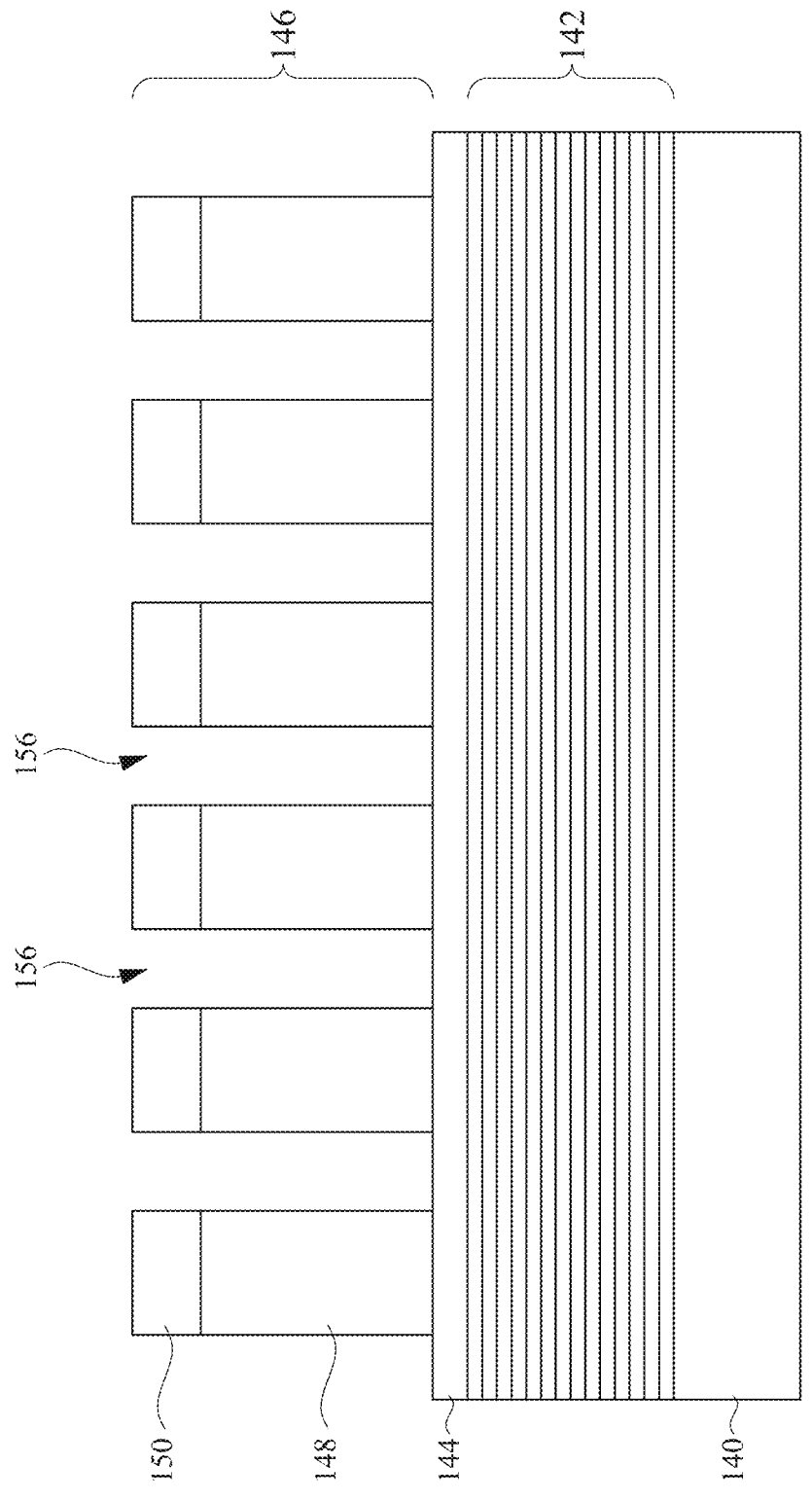
FIG. 2 is a cross-sectional view of an EUV reticle, in accordance with some embodiments.

FIG. 2 is a simplified cross-sectional view of an EUV reticle 101, in accordance with some embodiments. The reticle 101 includes a substrate 140, a reflective multilayer 142 positioned on the substrate 140, a buffer layer 144 positioned on the reflective multilayer 142, and an absorption layer 146 positioned on the buffer layer 144. The trenches 156 in the absorption layer 146 correspond to the pattern of the reticle 101 that will be imparted to the wafers 116.

The substrate 140 includes a low thermal expansion material. The low thermal expansion material substrate 140 serves to minimize image distortion due to heating of the reticle 101. The low thermal expansion material substrate 140 can include materials with a low defect level and a smooth surface.

In one embodiment, the substrate 140 can include $SiO_2$. The substrate 140 can be doped with titanium dioxide. The substrate 140 can include other low thermal expansion materials than those described above without departing from the scope of the present disclosure.

The reticle 101 includes the reflective multilayer 142. The reflective multilayer 142 is positioned on the substrate 140. The reflective multilayer 142 is configured to reflect the extreme ultraviolet light during photolithography processes in which the reticle 101 is used. The reflective properties of the reflective multilayer 142 are described in more detail below.

In one embodiment, the reflective multilayer 142 operates in accordance with reflective properties of the interface between two materials. In particular, reflection of light will occur when light is incident at the interface between two materials of different refractive indices. A greater portion of the light is reflected when the difference in refractive indices is larger.

One technique to increase the proportion of reflected light is to include a plurality of interfaces by depositing a multilayer of alternating materials. The properties and dimensions of the materials can be selected so that constructive interference occurs with light reflected from different interfaces. However, the absorption properties of the employed materials for the plurality of layers may affect the reflectivity that can be achieved.

Accordingly, the reflective multilayer 142 includes a plurality of pairs of layers. Each pair of layers includes a layer of a first material and a layer of a second material. The materials and thicknesses of the layers are selected to promote reflection and constructive interference of extreme ultraviolet light.

In one embodiment, each pair of layers includes a layer of molybdenum and a layer of silicon. In one example, the layer of molybdenum is between 2 nm and 4 nm in thickness. In one example, the layer of silicon is between 3 nm and 5 nm in thickness. The thicknesses of the layers in the reflective multilayer 142 are selected based on the expected wavelength of extreme ultraviolet light used in the photolithography processes and the expected angle of incidence of the extreme ultraviolet light during the photolithography processes. The wavelength of the extreme ultraviolet light is between 1 nm and 20 nm. The number of pairs of layers is between 20 pairs of layers and 60 pairs of layers, according to one embodiment. Other materials, thicknesses, numbers of pairs, and configurations of layers in the reflective multilayer 142 can be utilized without departing from the scope of the present disclosure. Other wavelengths of extreme ultraviolet light can be used without departing from the scope of the present disclosure.

In one embodiment, the buffer layer 144 is positioned on the reflective multilayer 142. One purpose of the buffer layer 144 is to protect the reflective multilayer during etching processes of the absorption layer 146. Accordingly, the buffer layer 144 includes materials that are resistant to etching by etching processes that etch the absorption layer 146. The etching processes and the materials of the absorption layer will be described in more detail below.

In one embodiment, the buffer layer 144 includes ruthenium. The buffer layer 144 can include compounds of ruthenium including ruthenium boride and ruthenium silicide. The buffer layer can include chromium, chromium oxide, or chromium nitride. The buffer layer 144 can be deposited by a low temperature deposition process to prevent diffusion of the buffer layer 144 into the reflective multilayer 142. In one embodiment, the buffer layer 144 has a thickness between 2 nm and 4 nm. Other materials, deposition processes, and thicknesses can be utilized for the buffer layer 144 without departing from the scope of the present disclosure.

The absorption layer 146 is positioned on the buffer layer 144. The material of the absorption layer 146 is selected to have a high absorption coefficient for wavelengths of extreme ultraviolet radiation that will be used in the photolithography processes with the reticle 101. In other words, the materials of the absorption layer 146 are selected to absorb extreme ultraviolet radiation.

In one embodiment, the absorption layer 146 is between 40 nm and 100 nm in thickness. In one embodiment, the absorption layer 146 includes material selected from a group including chromium, chromium oxide, titanium nitride, tantalum nitride, tantalum, titanium, aluminum-copper, palladium, tantalum boron nitride, tantalum boron oxide, aluminum oxide, molybdenum, or other suitable materials. Other materials and thicknesses can be used for the absorption layer 146 without departing from the scope of the present disclosure.

In one embodiment, the absorption layer 146 includes a first absorption layer 148 and a second absorption layer 150. The first absorption layer 146 is positioned on the buffer layer 144. The second absorption layer 150 is positioned on the first absorption layer 148.

In one embodiment, the first absorption layer 148 includes tantalum boron nitride. The second absorption layer 150 includes tantalum boron oxide. The thickness of the first absorption layer is between 30 nm and 80 nm. The thickness of the second absorption layer 150 is between 1 nm and 40 nm. The absorption layer 146 can include different materials, thicknesses, and numbers of layers than those described above without departing from the scope of the present disclosure. In one embodiment, the absorption layer 146 includes only a single absorption layer. Accordingly, the absorption layer 146 can be an absorption layer.

The pattern of trenches 156 corresponds to the pattern (or to the inverse of the pattern in some cases) that will be formed in the wafers 116. As described previously, the reflectivity, brightness, composition, and other parameters of the reticle 101 can change over time after repeated exposures. The reticle inspection system 103 is able to take such changes into account when inspecting and the reticle 101, as described previously.

Figure 3:
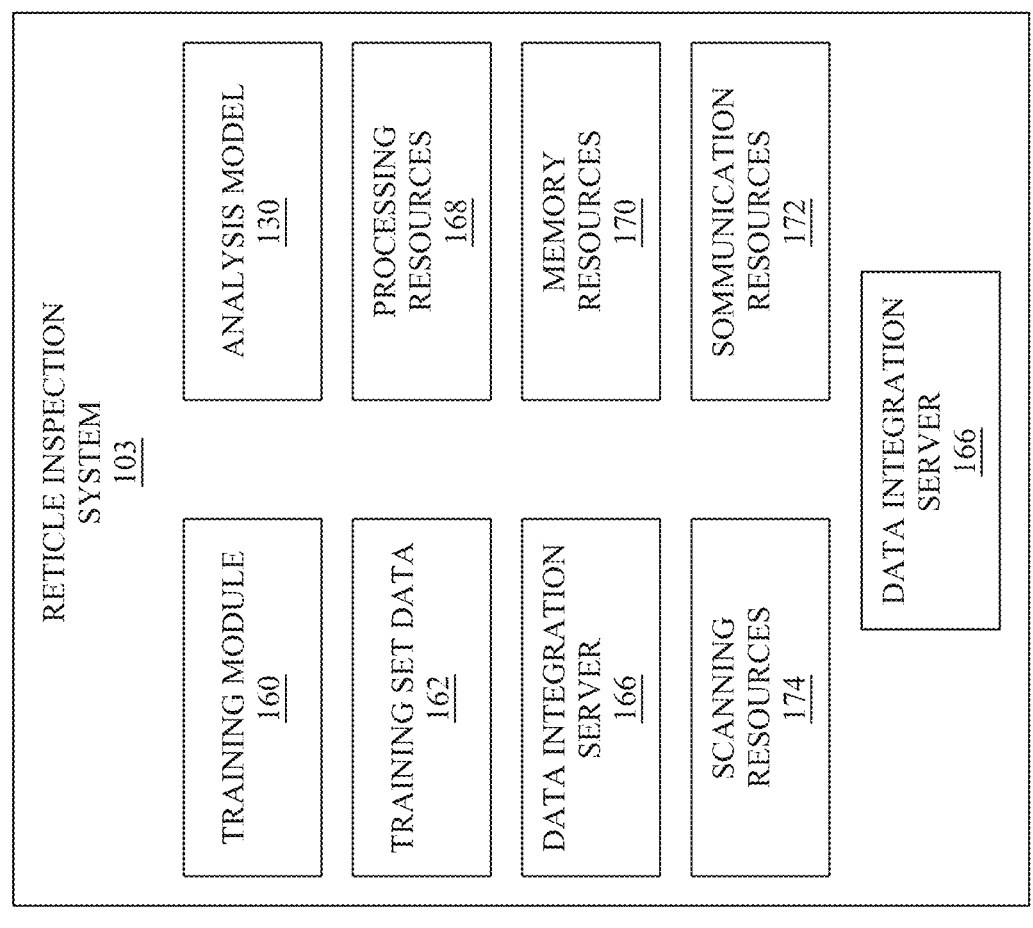
FIG. 3 is a block diagram of a reticle inspection system, in accordance with some embodiments.

FIG. 3 is a block diagram of the reticle inspection system 103 of FIG. 1, according to some embodiments. The reticle inspection system 103 is configured to inspect reticles 101 as described in relation to FIG. 1. The reticle inspection system 103 utilizes machine learning to detect defects in a reticle, determine whether to replace reference images 132 with the most recent scan images 134, and to generate simulated reference images as described previously.

In one embodiment, the reticle inspection system 103 includes an analysis model 130 and a training module 160. The training module 160 trains the analysis model 130 with a machine learning process. The machine learning process trains the analysis model 130 to detect defects in a reticle 101, to determine whether to detect defects in a reticle, determine whether to replace reference images 132 with the most recent scan images 134, and to generate simulated reference images as described previously. Although the training module 160 is shown as being separate from the analysis model 130, in practice, the training module 160 may be part of the analysis model 130. Furthermore, while the analysis model 130 is shown as a single analysis model, in practice, the analysis model 130 can include multiple different analysis models to perform the functions described herein.

The reticle inspection system 103 includes, or stores, training set data 162. The contents of the training set data 162 depend on the functionality being imparted to the analysis model 130. In some embodiments, the reticle inspection system 103 trains the analysis model 130 with a machine learning process to detect defects in the reticle 101. The machine learning process can include generating training set data 162 that includes images of reticles with defects and reticles without defects. During the machine learning process, the analysis model 130 is trained through iterations to correctly identify which images from the training set correspond to defective reticles in which images correspond to reticles without defect.

In some embodiments, the analysis model 130 can be utilized to determine what type of defect is present in the reticle 101. During the machine learning process of the analysis model 130, the training set data 162 can include labeled training set images based on whether or not there is a defect and what type of defect is present. The machine learning process can then be performed that trains the analysis model 130 to classify scan images as one of a plurality of types of defects or no defects at all. Some examples of defect classifications can include contamination by droplet debris, contamination by particles other than droplets, absorption degradation, reflection degradation, coating peeling, material concentration, scattering, roughness, coating deformation, oxidation, reduction, organic cross-link, or other types of defects.

In some embodiments, the analysis model 130 can be trained to generate simulated reference images 132. For example, the analysis model 130 can be trained with training set data that includes a large number of scan images across the lifetimes of a large number of reticles. The analysis model 130 can be trained to generate reference images based on the number of exposures and other operating parameters associated with the reticle 101. This is because the training process trains the analysis model to know what a healthy reticle 101 should look like at a given stage of life based on the number of exposures and based on other operating parameters associated with the reticle 101 and the reticle inspection system 103. The training set data 162 can include beam power, beam position, beam stability, beam size, wavelength purity, pulse duration, timing control, laser heating, lens heating, isolator stability, acousto-optic modulation (AOM) stability, acousto-optic tunable filter (AOTF) stability, and other parameters. The training set data 162 can include chip photoelectric conversion efficiency and stability, channel consistency calibration, and dark noise associated with charge coupled devices, CMOS devices, CMOS time delay integration devices, and other factors. The training set data 162 can include stage data such as vibration, X, Y, and Z direction stability, leveling, stage acceleration, and stage movement speed. The training set data 162 can include objective temperature, lens transmission, and focus stability. The training set data can include mask usage, EUV movement, exposure die size, dosage, material concentration, treatment, and storage time.

The training process can enable the analysis model 130 to generate simulated reference images based on the known characteristics of the reticle 101 and the reticle inspection system 103. In one embodiment the analysis model 130 includes a neural network. However, other types of analysis models or algorithms can be used without departing from the scope of the present disclosure.

In some embodiments, the reticle inspection system 103 includes processing resources 168, memory resources 170, and communication resources 172. The processing resources 168 can include one or more controllers or processors. The processing resources 168 are configured to execute software instructions, process data, perform reticle inspection processes, perform signal processing, read data from memory, write data to memory, and to perform other processing operations. The processing resources 168 can include physical processing resources 168 located at a site or facility of the photolithography system 100. The processing resources can include virtual processing resources 168 remote from the site of the photolithography system 100 or a facility at which the photolithography system 100 is located. The processing resources 168 can include cloud-based processing resources including processors and servers accessed via one or more cloud computing platforms.

In some embodiments, the memory resources 170 can include one or more computer readable memories. The memory resources 170 are configured to store software instructions associated with the function of the reticle inspection system and its components, including, but not limited to, the analysis model 130. The memory resources 170 can store data associated with the function of the reticle inspection system 103 and its components. The data can include the training set data 162, current process conditions data, and any other data associated with the operation of the reticle inspection system 103 or any of its components. The memory resources 170 can include physical memory resources located at the site or facility of the photolithography system 100. The memory resources can include virtual memory resources located remotely from site or facility of the photolithography system 100. The memory resources 170 can include cloud-based memory resources accessed via one or more cloud computing platforms.

In some embodiments, the communication resources can include resources that enable the reticle inspection system 103 to communicate with components associated with the photolithography system 100. For example, the communication resources 172 can include wired and wireless communication resources that enable the reticle inspection system 103 to receive the data associated with the photolithography system 100. The communication resources 172 can enable the reticle inspection system 103 to communicate with remote systems. The communication resources 172 can include, or can facilitate communication via, one or more networks such as wire networks, wireless networks, the Internet, or an intranet. The communication resources 172 can enable components of the reticle inspection system 103 to communicate with each other.

In some embodiments, the analysis model 130 is implemented via the processing resources 168, the memory resources 170, and the communication resources 172. The reticle inspection system 103 can be a dispersed reticle inspection system with components and resources and locations remote from each other and from the photolithography system 100.

In some embodiments, the reticle inspection system 103 includes a data integration server 166. The data integration server 166 collects data to be provided to the analysis model 130. For example, the data integration server 166 can gather and store the training set data 162. The data integration server 166 can receive data from one or more controllers implemented in accordance with the processing resources 168 and memory resources 170.

In some embodiments, the reticle inspection system 103 includes scanning resources 174. The scanning resources 174 can include components, processes, and systems utilized to generate scan images 134 of the reticle 101. This can include cameras, lasers, charge coupled devices, CMOS devices, stages, motors, sensors, and other components.

Figure 4:
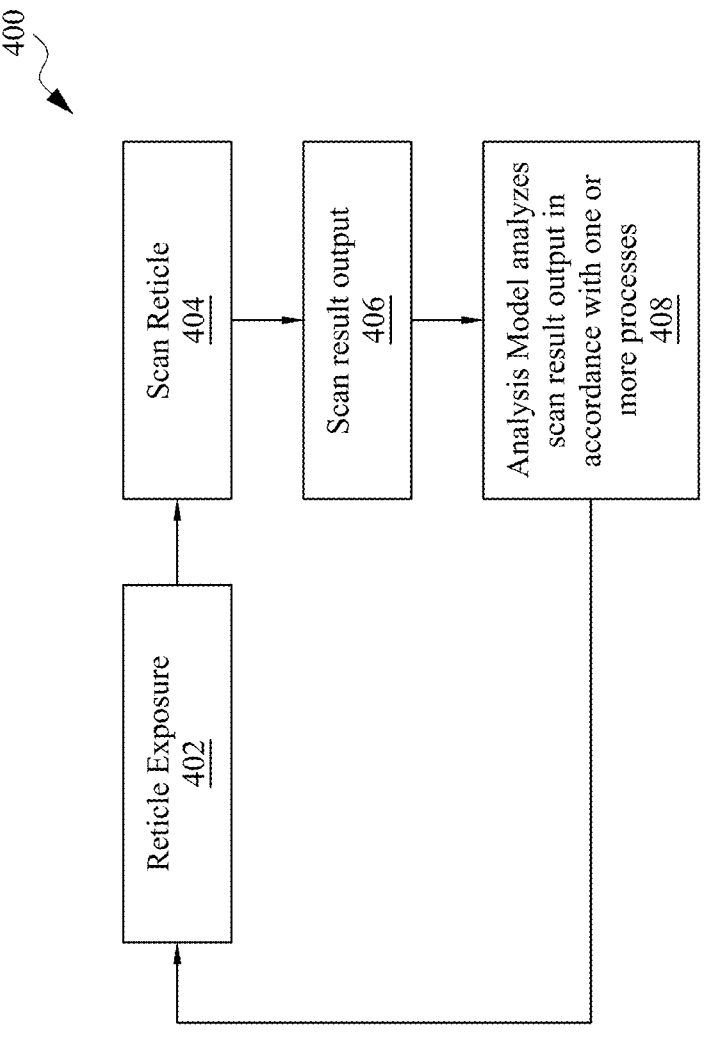
FIG. 4 is a flow diagram of a method for operating a reticle inspection system, in accordance with some embodiments.

FIG. 4 is a flow diagram of a method 400, in accordance with some embodiments. The method 400 can utilize components, processes, and systems described in relation to FIGS. 1-3, as well as in subsequent figures. At 402, an EUV reticle is exposed during a photolithography process. At 404, the reticle inspection system 103 scans the reticle. At 406, the scan results is output by the reticle inspection system 103. At 408, the analysis model 130 analyzes the scan results output in accordance with one or more processes. The processes utilized by the analysis model can include one or more of semiautomated defect detection, fully automated defect detection, reference image replacement, and reference image simulation. If no defects are detected, then the reticle 101 is again exposed to a photolithography process at 402. If defects are detected, then the reticle 101 can be cleaned.

Figure 5:
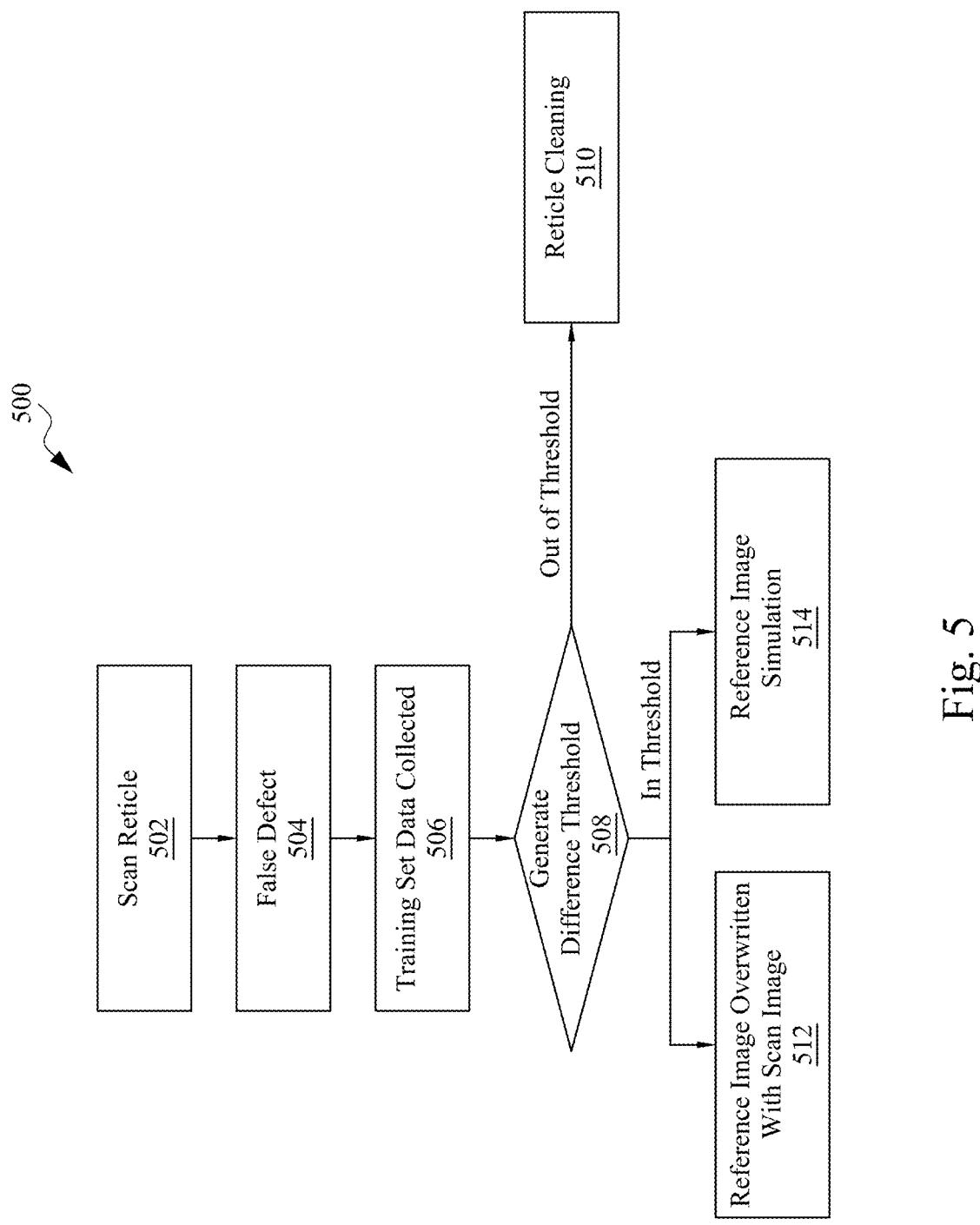
FIG. 5 is a flow diagram of a method for operating a reticle inspection system, in accordance with some embodiments.

FIG. 5 is a flow diagram of a method 500, in accordance with some embodiments. The method 500 can utilize components, processes, and systems described in relation to FIGS. 1-4, as well as in subsequent figures. At 502 a reticle 101 is scanned by a reticle inspection system 103. At 504, the reticle inspection system 103 falsely detects a defect. At 506, training set data is collected for one or more machine learning processes. While FIG. 5 illustrates the training set data being collected after detecting a false defect, in practice, the training set data and corresponding machine learning processes are performed previously. At 508, machine learning processes are performed to generate a different threshold as described previously. The scan images are then compared to reference images. If the difference between the scan images and the reference images is outside the difference threshold, then at 510 the reticle was sent for cleaning. If the difference between the scan images and the reference images is within the difference threshold, then the analysis model performs a process at either 512 or 514. At 512, the reference image is wholly or partially overwritten with the latest scan image as described previously. At 514, one or more simulated reference images is generated. This can either substitute the old reference or set up a new reference.

Figure 6:
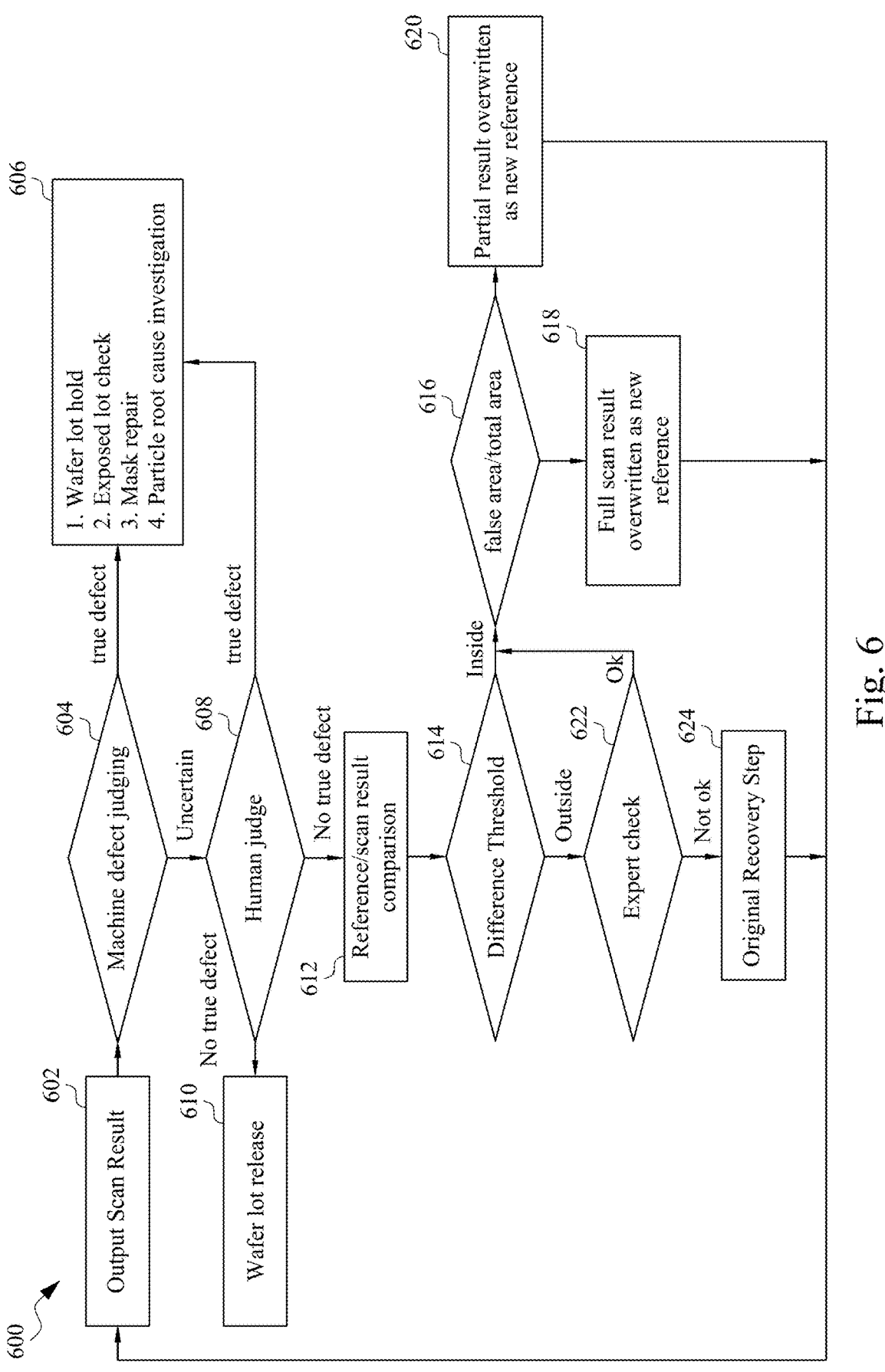
FIG. 6 is a flow diagram of a method for operating a reticle inspection system, in accordance with some embodiments.

FIG. 6 is a flow diagram of a method 600, in accordance with some embodiments. The method 600 can utilize components, processes, and systems described in relation to FIGS. 1-5, as well as in subsequent figures. At 602, a reticle inspection system 103 scans a reticle 101 and outputs scan results. At 604, the reticle inspection system 103 makes a machine defects judgment based on the output scan results. If the machine defects judgment determines with certainty that a true defect is present in the reticle 101, then at 606 the wafer lot that was processed by the reticle is put on hold, the lot is checked, the reticle 101 is repaired, and a root cause investigation is performed to determine the source of the defect.

If the machine defects judgment is uncertain, then at 608 a human judge may review the scan results. If the human judge determines that a defect is present, the process proceeds to 606 as described previously. If the human judge determines that no true defect is present, then at 610 the wafer lot is released and at 612 the analysis model 130 compares the reference image to the scan images. At 614 the analysis model determines whether or not the comparison is within the difference threshold. If the comparison is within the difference threshold, then at 616 the analysis model performs a check of the ratio of the falsely defective area to the total area. If the ratio is greater than a threshold ratio, then the entire reference image is rewritten with the most recent scan image. If the ratio is less than or equal to the threshold ratio, then at 620 the reference images partially rewritten with a portion of the scan image. From 618 and 620, the method returns to 602.

At 614, if the comparison is outside the difference threshold, then at 622 and expert may check the results. If no true defect is detected, then the process proceeds to 616. If a true defect is detected at 622, the process proceeds to an original recovery step at 624. The original recovery step corresponds to steps 606.

Figure 7:
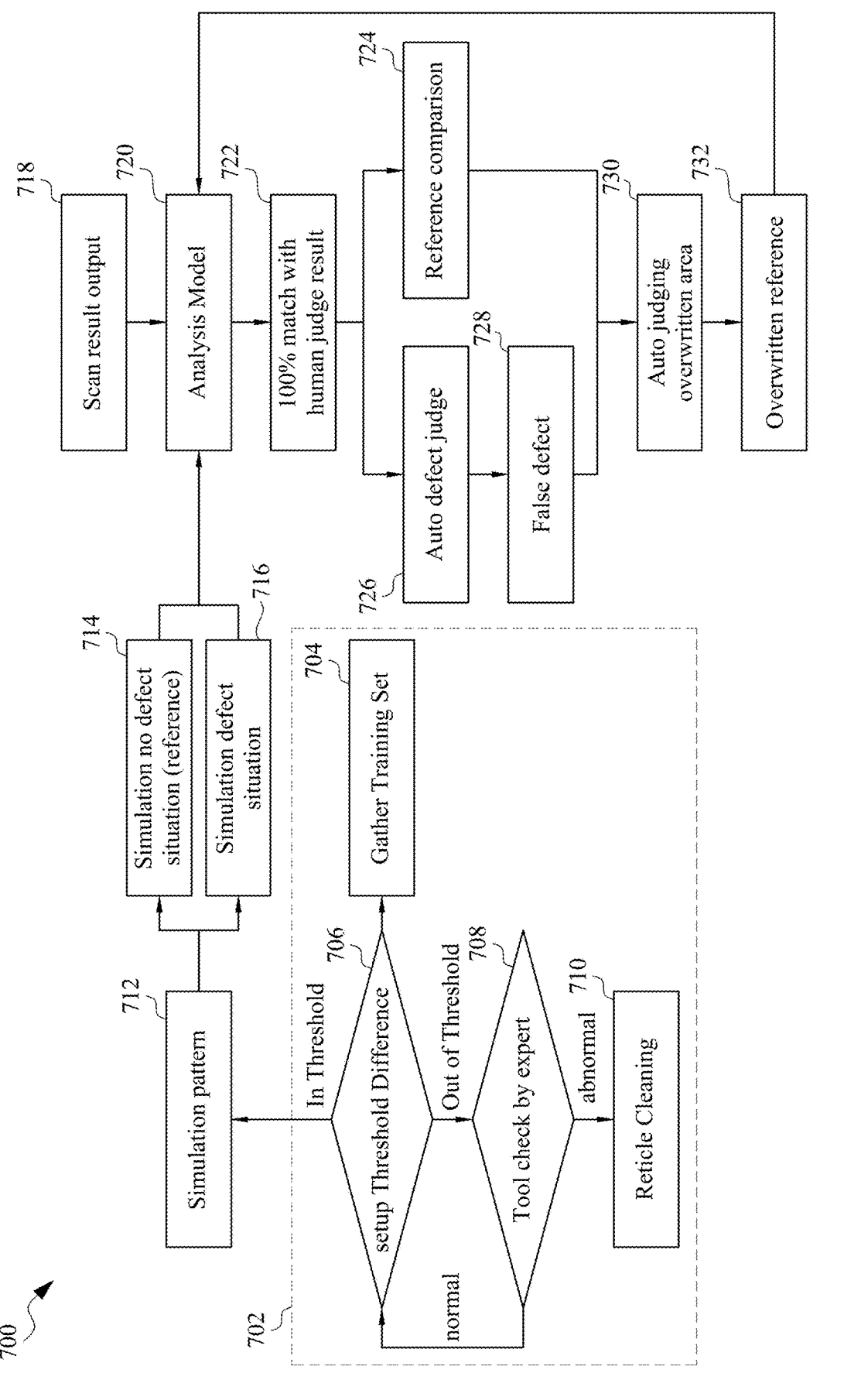
FIG. 7 is a flow diagram of a method for operating a reticle inspection system, in accordance with some embodiments.

FIG. 7 is a flow diagram of a method 700, in accordance with some embodiments. The method 700 can utilize components, processes, and systems described in relation to FIGS. 1-6, as well as in subsequent figures. At 702, initial set up for reticle inspection is performed. At 704, the training set is gathered, as described previously. A machine learning process is performed to train an analysis model. At 706, a threshold difference is generated based on the machine learning process. If a scan result is within a threshold, then the method proceeds to 712. If the scan results is outside the threshold difference, then at 708 and expert may check the results. If the result is abnormal, that the reticle may be sent to reticle cleaning at 710. If the result is normal, but the process returns to 706.

At 712, a reticle pattern the simulated. The reticle pattern corresponds to the pattern intended to be carried by the reticle 101. At 714, simulated images representing a no-defect situation are generated. At 716, simulated images representing a defect situation are generated. At 718 the reticle inspection system 103 outputs a scan results to the analysis model. The analysis model also receives the defective and not defective simulated reference images. At 720, the analysis model analyzes the scan results. If the analysis model aligns 100% with human judging at 722, the process may proceed to 724 or 726. At 724 comparison is made between the scan images and the reference images. At 726 and automatic defect judgment is performed. If there is no defect at 728, then the process proceeds to 730. At 730, judgment is performed to determine whether a portion of the previous reference image will be overwritten. At 732, the reference images partially or wholly overwritten and provided to the analysis model.

Figure 8:
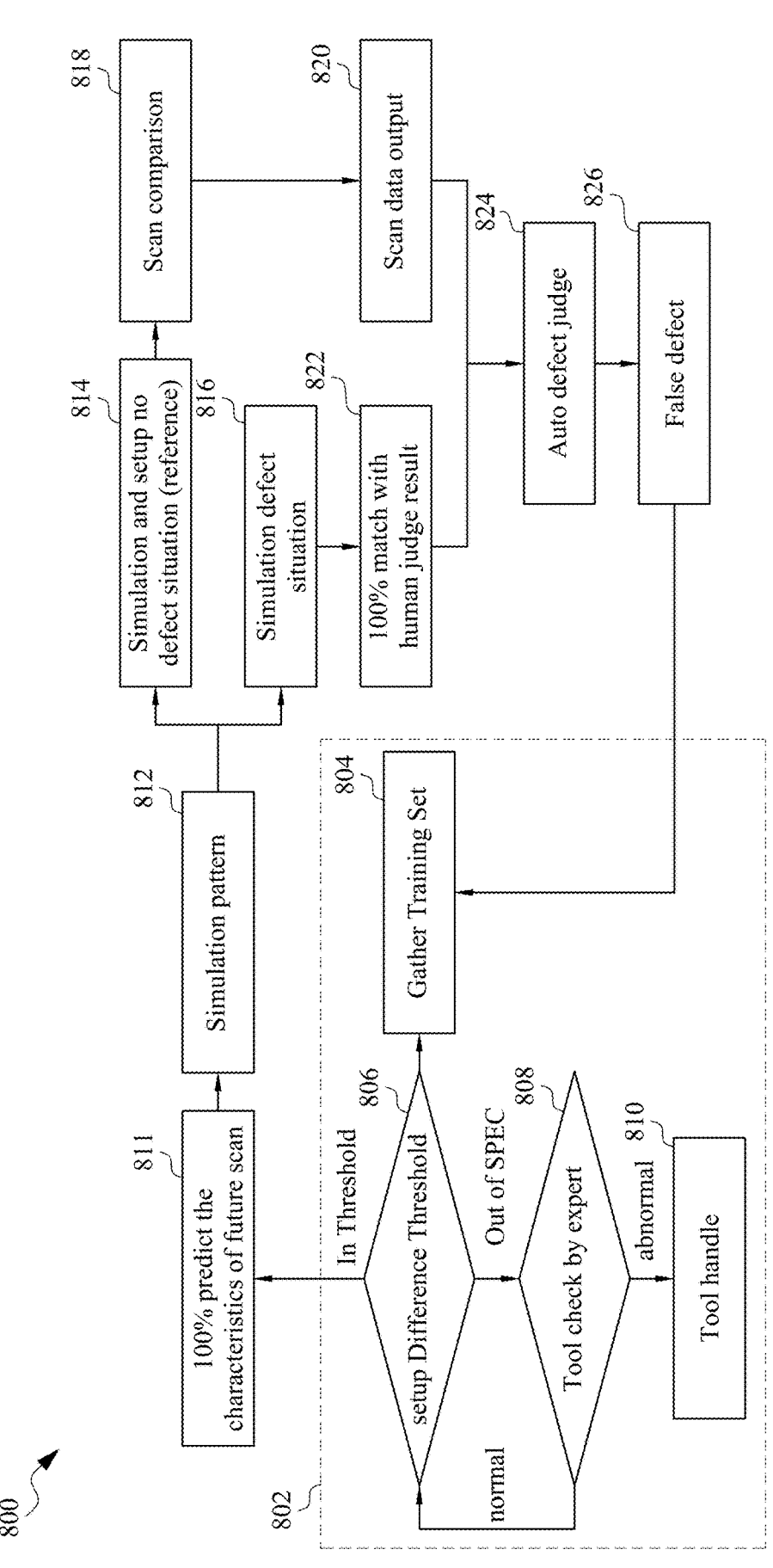
FIG. 8 is a flow diagram of a method for operating a reticle inspection system, in accordance with some embodiments.

FIG. 8 is a flow diagram of a method 800, in accordance with some embodiments. The method 800 can utilize components, processes, and systems described in relation to FIGS. 1-7, as well as in subsequent figures. At 802, initial set up for reticle inspection is performed. At 804, the training set is gathered, as described previously. A machine learning process is performed to train an analysis model. At 806, a threshold difference is generated based on the machine learning process. If the scan result is within a threshold, then the method proceeds to 812. If the scan result is outside the threshold difference, then at 808 and expert may check the results. If the result is abnormal, that the reticle may be sent to reticle cleaning at 810. If the result is normal, but the process returns to 806.

At 811, the characteristics of future scans are predicted by the analysis model based on the machine learning process. At 812, a reticle pattern the simulated. The reticle pattern corresponds to the pattern intended to be carried by the reticle 101. At 814, simulated images representing a no-defect situation are generated. At 816, simulated images representing a defect situation are generated. At 818 a scan comparison is performed. At 820 scan data is output. At 822 if there is a 100% match with a human judging result, the process proceeds to 824. At 824, and automated defect judgment is performed. If there is a false defect, then the result is provided to the training set.

Figure 9:
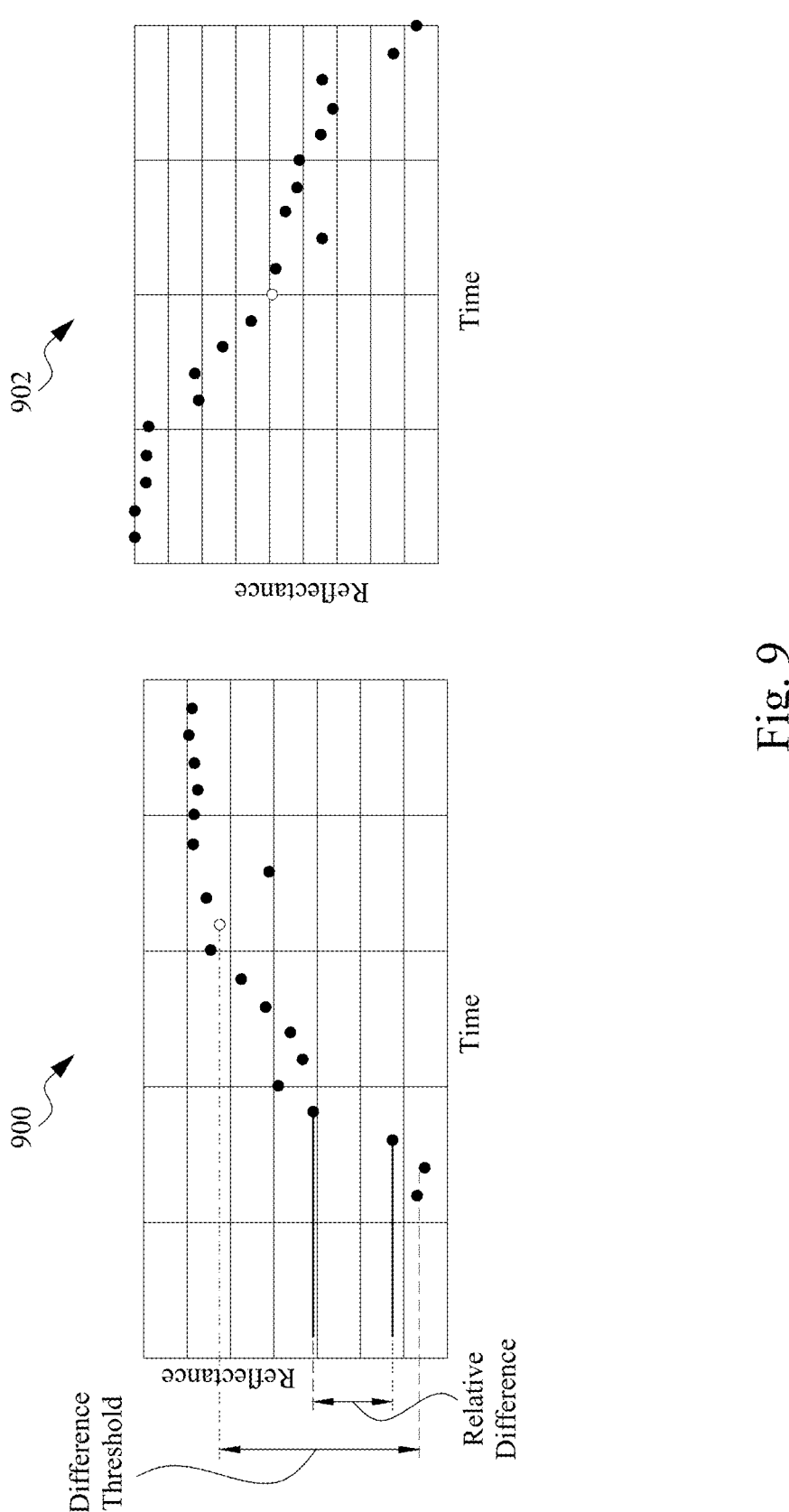
FIG. 9 includes graphs illustrating reflectance of reticles, in accordance with some embodiments.

FIG. 9 illustrates graphs indicating reflectance measurements of a reticle over time, in accordance with some embodiments. FIG. 9 illustrates a difference threshold as described previously. FIG. 9 also illustrates a relative difference. The relative difference corresponds to the difference between a current scan image and the current reference image. The reference image may be updated with the most recent scan results after each inspection. The combination of the difference threshold and the relative difference can help to ensure that a reticle is not falsely determined to be defective. The graph 900 corresponds to reticle for which the reflectance increases over time. The graph 902 corresponds to a reticle for which the reflectance decreases over time. If the relative differences within the difference threshold, then no defect is detected. If the relative difference is outside the difference threshold, then a defect is detected. As described previously, over time characteristics of the reticles may vary. Furthermore characteristics of the reticle inspection system may vary over time. The use of the difference threshold can help to ensure that these variances do not result in a false determination of defect in a reticle.

Figure 10:
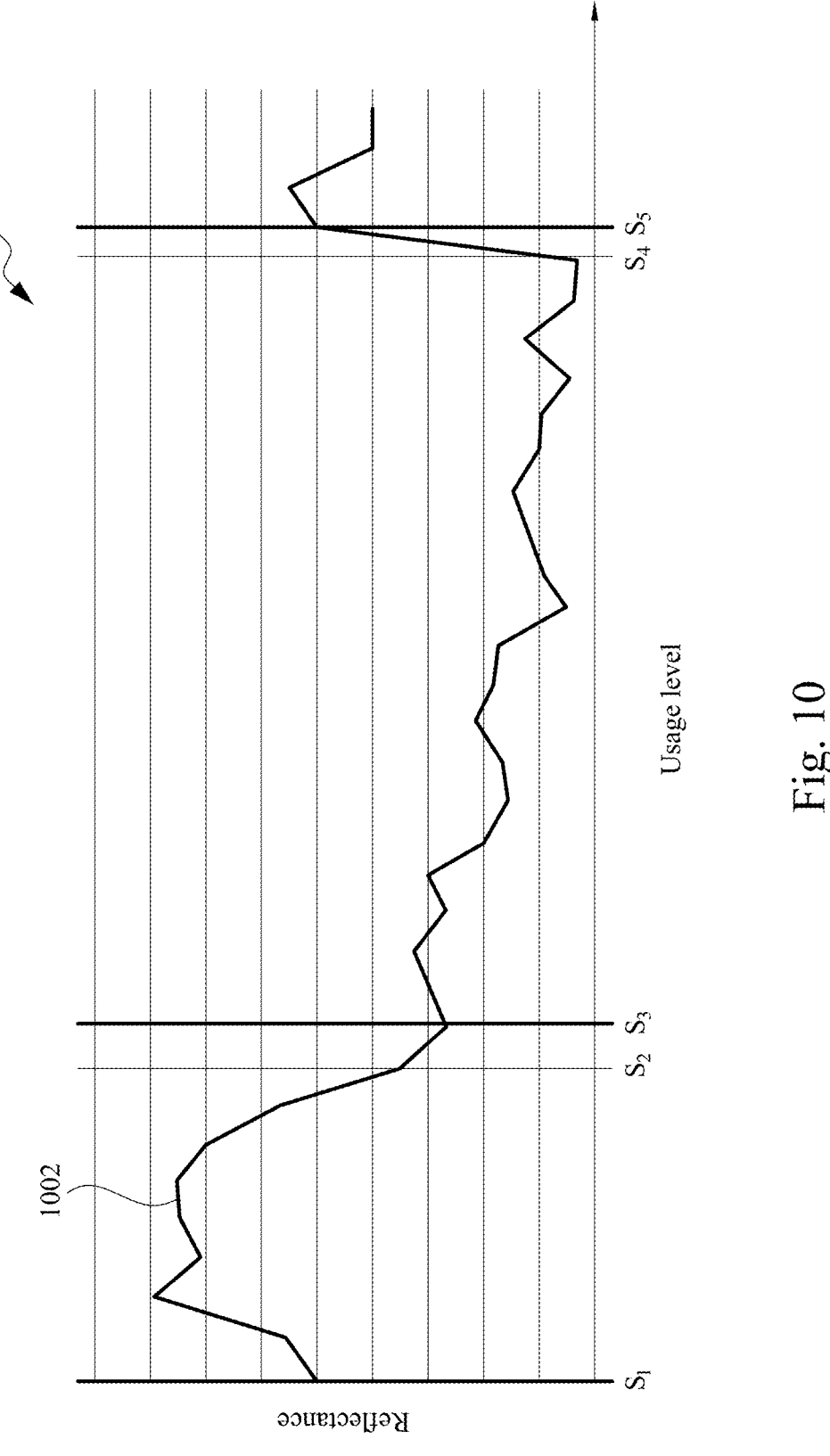
FIG. 10 includes a graph illustrating reflectance of a reticle, in accordance with some embodiments.

FIG. 10 is a graph 1000 illustrating reflectance of reticle versus usage level, in accordance with some embodiments. The reticle characteristics can change depending on the usage condition or usage level such as exposure times, dosage, exposure area or other parameters. The trending results can be separated by stages. At usage level S1, a reference image is collected. At usage level S2, a scan failure occurs. At usage level S3, a reference images collected. At usage level S4, a scan failure occurs. At usage level S5, a reference image is collected.

Figure 11:
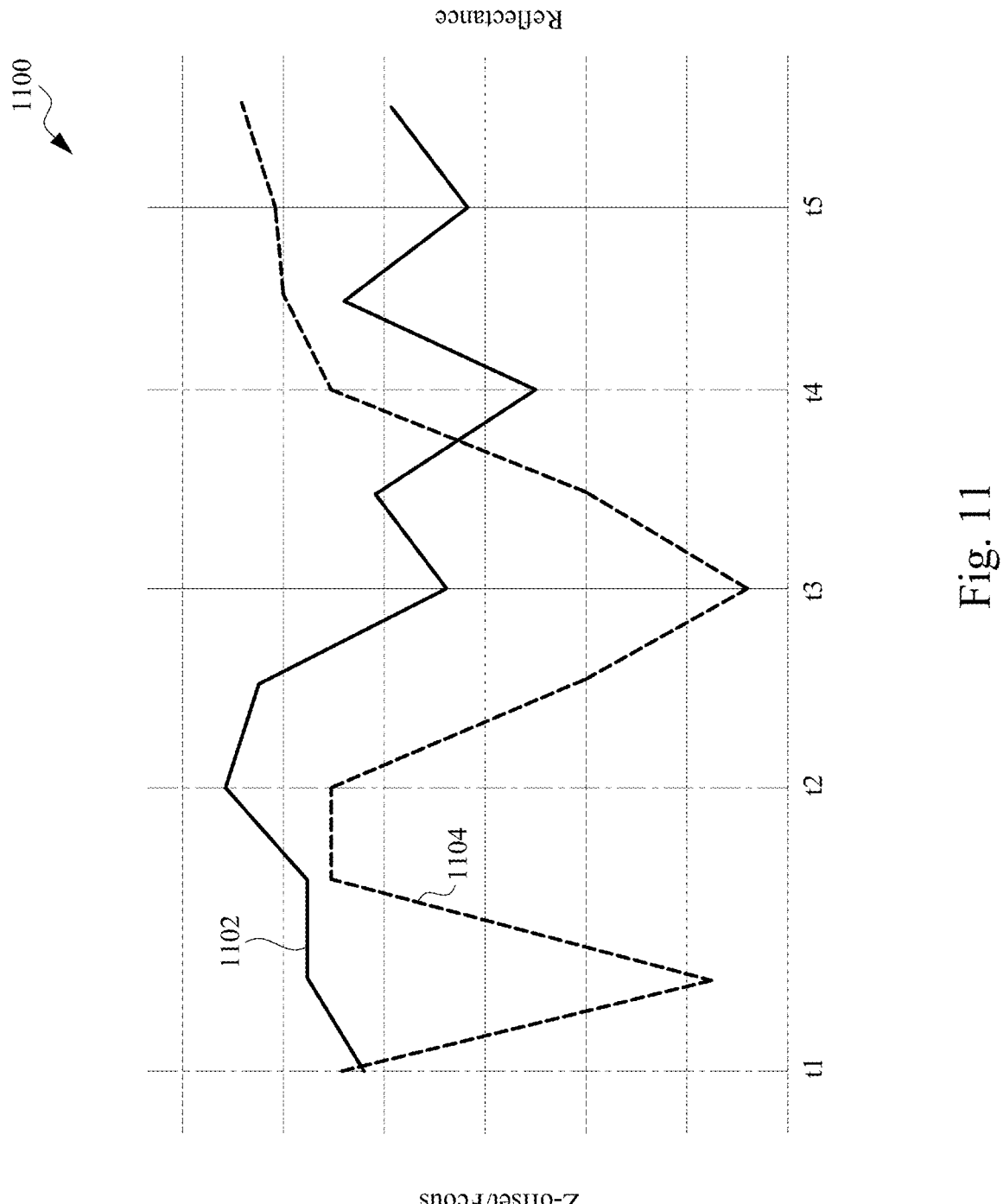
FIG. 11 includes a graph illustrating reflectance and Z-offset of a reticle, in accordance with some embodiments.

FIG. 11 is a graph 1100 of Z offset/focus (curve 1102) and reflectance (curve 1104) over time, in accordance with some embodiments. In high activity materials there can be extreme instability of characteristics and performance. Furthermore, some materials with external treatments will also display the same behavior. The characteristics of the reticle are affected by the concentration change of the elements. The no material treatment of the mask can be used for future scan characteristics production and reference simulation the results can improve performance of the reticle inspection system 103. In the graph 1100, reference images are collected at t1, t2, and t4. Scan failures are recorded at t3 and t5.

Figure 12:
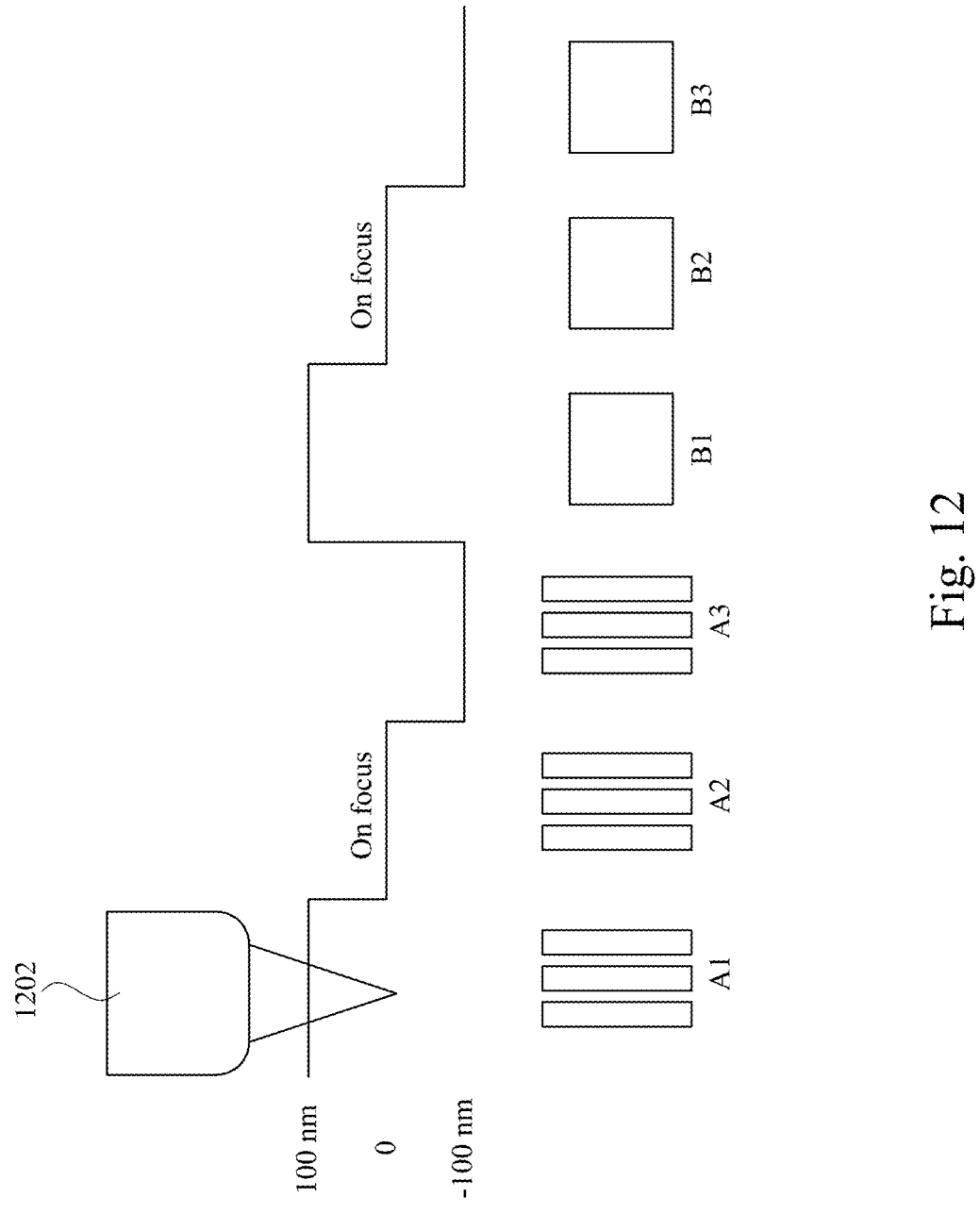
FIG. 12 illustrates reticle patterns and focus levels associated with reticle inspection processes, in accordance with some embodiments.

FIG. 12 illustrates principles associated with generating scan images of a reticle, in accordance with some embodiments. FIG. 12 illustrates three patterns of trenches A1, A2, and A3 (as seen in top view of a reticle 101) each having different heights (not apparent in top view). FIG. 12 also illustrates the features B1, B2, and B3 having different heights. The reticle inspection system 103 identifies the position change for focusing on each pattern. In the example of FIG. 12, 0 offset corresponds to the default offset of the objective lens. Levels of 100 nm correspond to a rise of 100 nm of the objective lens to focus on patterns A1 and B1. Patterns A2 and B2 are at the default level. Patterns A3 and B3 are at a level corresponding to a decrease in height of 100 nm. the best focus can be selected for scanning a specific pattern. These patterns can be formed in an EUV alignment area.

In some potential solutions, image on focus may be evaluated by leveling objective. However, in accordance with some embodiments herein, the pattern is designed with different height. Therefore, it is not needed to scan on a specific pattern several times to find the focus. The focus could be found by one time scanning on the different height patterns. For instance, pattern with height of −100, −50, −0, +50, +100 nm. Patterns with different height could be setup as a group. For example, a horizontal pattern with height from −100 nm to +100 nm. A cube pattern could have a height from −100 to +100 nm.

Figure 13:
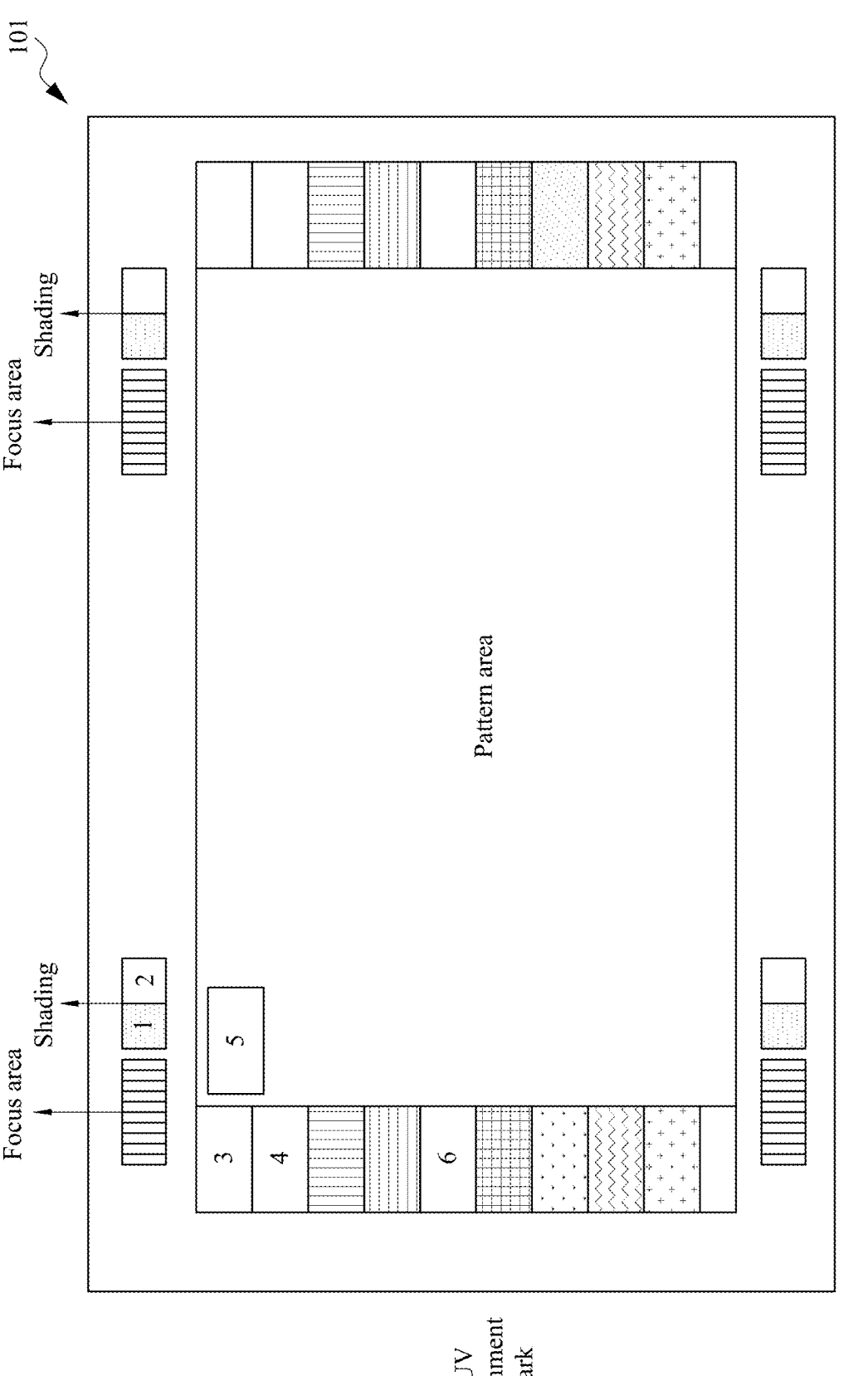
FIG. 13 is a top view of a reticle, in accordance with some embodiments.

FIG. 13 is a top view of a reticle 101, in accordance with some embodiments. The pattern area is the central area of the reticle 101. However, alignment marks, focus areas (e.g., A1-B3), and shading areas are arranged around the periphery of the pattern area. The reticle inspection system 103 can utilize a six-point shading calibration that uses the various purple areas and the pattern area in shading calibration. This can be utilized by the reticle inspection system 103 in inspecting reticles.

In some potential solutions, the shading of the collected image is calibrated by the shading point and alignment point. However, the shading area may not have been subjected to exposure, but the EUV dosage of the alignment area is proportionally different from the pattern area. The calibration may not be able to fully correct the brightness change of the pattern area.

In accordance with some embodiments, points 1 and 2 are almost infinity which can help for defining the camera response correlate to the target brightness. The gray level of points 3 and 4 point and point 6 are able to set up a function of the performance after exposure. Point 1 has same pattern design same as point 3. Point 2 has same pattern design as point 4. Since the point 5 and 6 are the same pattern design on different area, where have ratio dose exposure. The Function represents that pattern area brightness performance and alignment area performance should have the same slope and a different constant.

Figure 14:
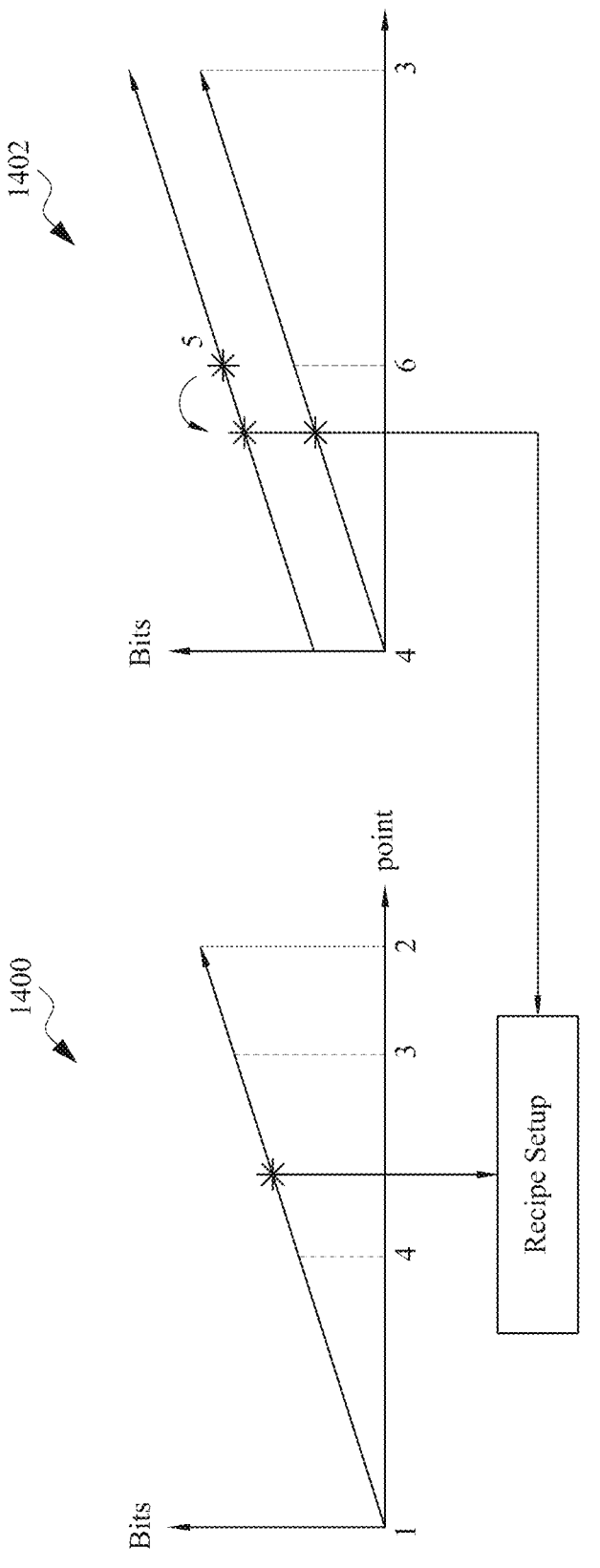
FIG. 14 includes graphs associated with calibrating a reticle inspection system, in accordance with some embodiments.

FIG. 14 illustrates graphs 1400 and 1402 associated with shading calibration with reference to FIG. 13, in accordance with some embodiments. The graph 1400 represents camera correction. Since point 1 and 2 are infinity, point 1 could be correct as darkest and point 2 could be defined as brightest. Under this analog-to-digital conversion, the signal response of point 3 and 4 can be obtained. The ratio of point 3 to recipe setup and point 4 to recipe setup can be calculated.

In the graph of FIG. 1402, to setup a function represents the brightness performance after exposure, point 3 and 4 are setup as darkest and brightest. The ratio calculated on latest paragraph could help define the target response in new function. Also, the signal of point 5 and 6 can be read under this condition. Because the pattern area and alignment area has directly proportional dose exposure, the function represent pattern area performance should serve same slope with alignment area function. Point 5 and 6 are the same pattern design located on different exposure area, the analog signal of the point 6 would be taken as X on the function which follows with the digital signal of point 5 as Y, the constant of the function then could be calculated and the pattern area function could be setup. The function represents that the correction result could be calculated by fitting the point 5 on pattern area function to the digital signal of recipe setup target on alignment area function. The curve 1404 corresponds to the alignment area function. The curve 1403 corresponds to the pattern area function.

FIG. 15 is a flow diagram of a method 1500, in accordance with some embodiments. The method 1500 can utilize processes, components, and systems described in relation to FIGS. 1-14. At 1502, the method 1500 includes training an analysis model of a reticle inspection system with a machine learning process. One example of an analysis model is the analysis model 130 of FIG. 1. One example of a reticle inspection system is the reticle inspection system of FIG. 1. At 1504, the method 1500 includes generating a difference threshold based on the machine learning process. At 1506, the method 1500 includes storing a reference image. One example of a reference image is the reference image 132 of FIG. 1. At 1508, the method 1500 includes generating a first scan image of a reticle with the reticle inspection system. At 1510, the method 1500 includes generating a first relative difference value by comparing the first scan image to the reference image. At 1512, the method 1500 includes, if the first relative difference value is less than the difference threshold, determining that the reticle is not defective. At 1514, the method 1500 includes, if the first relative difference value is greater than the difference threshold, determining that the reticle is defective.

FIG. 16 is a flow diagram of a method 1600, in accordance with some embodiments. The method 1600 can utilize processes, components, and systems described in relation to FIGS. 1-15. At 1602, the method 1600 includes training an analysis model of a reticle inspection system with a machine learning process to detect whether a reticle is contaminated with a debris particle and to classify a type of the debris particle. One example of a reticle inspection system is the reticle inspection system 103 of FIG. 1. One example of an analysis model is the analysis model 130 of FIG. 1. At 1604, the method 1600 includes generating a scan image of a reticle with the reticle inspection system. One example of a scan image is the scan image 134 of FIG. 1. At 1606, the method 1600 includes providing the scan image to the analysis model. At 1608, the method 1600 includes determining, with the analysis model based on the machine learning process, whether or not the reticle is contaminated with a debris particle by processing the scan image. At 1610, the method 1600 includes, if the reticle is contaminated with a debris particle, determining a type of the debris particle with the analysis model.

Embodiments of the disclosure provide a system and method for reliably inspecting photolithography reticles. Embodiments of the present disclosure utilize a reticle inspection system that includes an analysis model trained with a machine learning process to assist in inspecting photolithography reticles between exposures. The reticle inspection system stores one or more reference images of a reticle. In an inspection process, the reticle inspection system captures new scans of a reticle and compares them to the reference images. The reticle inspection system utilizes the analysis model to ensure that the inspection is accurate and efficient so that a reticle is not erroneously determined to be defective.

In some embodiments, the reticle inspection system can train the analysis model with a training set that includes images or scans of both defective and non-defective reticles. After training, the analysis model can analyze scans of a reticle to determine whether or not the reticle is defective. In some embodiments, the analysis model can judge whether or not a reticle is defective and can also help to judge types of defects. The analysis model can also be utilized to determine whether or not a current scan of a reticle should be utilized to partially or completely overwrite one or more reference images utilized by the reticle inspection system. In some embodiments, reticle characteristic parameters and reticle inspection system parameters can be provided to a machine learning database for training the analysis model. The analysis model can then generate simulated reference images to assist in future inspections of reticles. This can help reduce false defect counts and improve inspection tool quality.

Embodiments of the present disclosure provide several benefits. In particular, the number of false defect counts is greatly reduced or entirely eliminated. This results in fewer instances of unnecessary reticle cleaning and wafer inspection. This helps ensure that wafer processing is not halted, resulting in more processed wafers over time and better wafer yields. Expensive reticle cleaning is also avoided.

In one embodiment, a method for operating a reticle inspection system includes training an analysis model of the reticle inspection system with a machine learning process, generating a difference threshold based on the machine learning process, storing a reference image, and generating a first scan image of a reticle with the reticle inspection system. The method includes generating a first relative difference value by comparing the first scan image to the reference image. The method includes, if the first relative difference value is less than the difference threshold, determining that the reticle is not defective. The method includes, if the first relative difference value is greater than the difference threshold, determining that the reticle is defective.

In one embodiment, a reticle inspection system includes scanning resources configured to capture a scan image of a reticle, memory resources configured to store a reference image, and an analysis model trained with a machine learning process to generate a difference threshold, to generate a relative difference value by comparing the scan image to the reference image, and to rewrite at least a portion of the reference image if the relative difference value is less than the difference threshold.

In one embodiment, a method includes training an analysis model of a reticle inspection system with a machine learning process to detect whether a reticle is contaminated with a debris particle and to classify a type of the debris particle. The method includes generating a scan image of a reticle with the reticle inspection system and providing the scan image to the analysis model. The method includes determining, with the analysis model based on the machine learning process, whether or not the reticle is contaminated with a debris particle by processing the scan image and if the reticle is contaminated with a debris particle, determining a type of the debris particle with the analysis model.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   training an analysis model of a reticle inspection system with a machine learning process;
   generating a difference threshold based on the machine learning process;
   storing a reference image;
   generating a first scan image of a reticle with the reticle inspection system;
   generating a first relative difference value by comparing the first scan image to the reference image;
   if the first relative difference value is less than or equal to the difference threshold, determining that the reticle is not defective and rewriting at least a portion of the reference image with the first scan image;
   if the first relative difference value is greater than the difference threshold, determining that the reticle is defective;
   performing a photolithography process with the reticle after rewriting the reference image with at least a portion of the first scan image;

generating a second scan image of the reticle with the reticle inspection system;
generating a second relative difference value by comparing the second scan image to the reference image;
if the second relative difference value is less than or equal to the difference threshold, determining that the reticle is not defective; and
if the second relative difference value is greater than the difference threshold, determining that the reticle is defective.

2. The method of claim 1, comprising rewriting the entirety of the reference image with the first scan image.

3. The method of claim 1, comprising:
   generating a ratio of a false defect area of the first scan image to a total pattern area of the first scan image based on comparing the first scan image to the reference image; and
   comparing the ratio to a threshold ratio.

4. The method of claim 3, comprising:
   if the ratio is greater than the threshold ratio, rewriting an entirety of the reference image with the first scan image; and
   if the ratio is less than or equal to the threshold ratio, rewriting only a portion of the reference image with the false defect area of the first scan image.

5. The method of claim 1, comprising, if the first relative difference value is less than the difference threshold, rewriting at least a portion of the reference image with the second scan image.

6. The method of claim 1, wherein training the analysis model includes training the analysis model to generate simulated reference images.

7. The method of claim 6, comprising:
   generating a first simulated reference image with the analysis model and storing the first simulated reference image as the reference image prior to generating the first scan image;
   if the first relative difference value is less than or equal to the difference threshold, performing a photolithography process with the reticle;
   generating, after performing the photolithography process, a second simulated reference image; and
   replacing the reference image with the second simulated reference image.

8. The method of claim 7, further comprising:
   generating a second scan image of the reticle with the reticle inspection system after performing the photolithography process;
   generating a second relative difference value by comparing the second scan image to the reference image;
   if the second relative difference value is less than or equal to the difference threshold, determining that the reticle is not defective; and
   if the second relative difference value is greater than the difference threshold, determining that the reticle is defective.

9. The method of claim 6, wherein training the analysis model to generate simulated reference images includes training the analysis model to generate simulated reference images based on reticle parameters and reticle inspection system parameters.

10. The method of claim 1, wherein the difference threshold is a reticle reflectivity difference threshold.

11. The method of claim 1, wherein the difference threshold is a reticle brightness difference threshold.

12. A reticle inspection system, comprising:

scanning resources configured to capture a scan image of a reticle;

memory resources configured to store a reference image; and an analysis model trained with a machine learning process to generate a difference threshold, to:

generate a difference threshold;

generate a relative difference value by comparing the scan image to the reference image;

rewrite at least a portion of the reference image with the scan image if the relative difference value is less than or equal to the difference threshold;

generate simulated reference images;

generating a first simulated reference image with the analysis model and storing the first simulated reference image as the reference image prior to generating the first scan image;

if the first relative difference value is less than or equal to the difference threshold, approve the reticle for performance of a photolithography process with the reticle;

generate, after performance of the photolithography process with the reticle, a second simulated reference image; and replacing the reference image with the second simulated reference image.

13. The reticle inspection system of claim 12, wherein the analysis model is configured to generate a simulated reference image and to rewrite the reference image with the simulated reference image if the relative difference value is less than or equal to the threshold value.

14. The reticle inspection system of claim 12, wherein the analysis model is configured to determine that the reticle should be passed to a reticle cleaning system if the relative difference value is greater than the difference threshold.

15. A method, comprising:

training an analysis model of a reticle inspection system with a machine learning process to detect whether a reticle is contaminated with a debris particle and to classify a type of the debris particle;

generating a scan image of a reticle with the reticle inspection system;

providing the scan image to the analysis model;

determining, with the analysis model based on the machine learning process, whether or not the reticle is contaminated with a debris particle by processing the scan image; and if the reticle is contaminated with a debris particle, determining a type of the debris particle with the analysis model.

16. The method of claim 15, wherein determining the type of the debris particle includes determining an elemental makeup of the debris particle.

17. The method of claim 16, comprising determining, with the analysis model, whether or not the debris particle derives from a droplet utilized in generating extreme ultraviolet light for a photolithography process.

18. The method of claim 12, wherein the difference threshold is a reticle brightness difference threshold.

19. The method of claim 12, wherein the analysis model is configured to determine whether or not the reticle is contaminated with a debris particle by processing the scan image.

20. The method of claim 19, wherein the analysis model is configured to determine a type of the debris particle.

* * * * *